(12) United States Patent
Ota

(10) Patent No.: US 12,401,193 B2
(45) Date of Patent: Aug. 26, 2025

(54) SEMICONDUCTOR DEVICE

(71) Applicant: ROHM CO., LTD., Kyoto (JP)

(72) Inventor: Akihiro Ota, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 132 days.

(21) Appl. No.: 18/498,530

(22) Filed: Oct. 31, 2023

(65) Prior Publication Data

US 2024/0154408 A1 May 9, 2024

(30) Foreign Application Priority Data

Nov. 7, 2022 (JP) .................................. 2022-177814

(51) Int. Cl.
*H02H 9/04* (2006.01)
*H03K 17/56* (2006.01)

(52) U.S. Cl.
CPC ............ *H02H 9/046* (2013.01); *H03K 17/56* (2013.01)

(58) Field of Classification Search
CPC .......... H02H 9/046; H02H 9/02; H03K 17/56; G01R 1/203; G01R 19/0092
USPC ........................................... 361/93.1
See application file for complete search history.

(56) References Cited

U.S. PATENT DOCUMENTS

| | | | | |
|---|---|---|---|---|
| 3,921,035 A | * | 11/1975 | Holmes ................ | H05B 41/392 315/307 |
| 5,444,597 A | * | 8/1995 | Blake .................. | H01L 21/6831 361/234 |
| 8,498,089 B2 | * | 7/2013 | Lorentz .............. | H03K 17/0822 323/277 |
| 11,322,926 B2 | * | 5/2022 | Niehoff .................. | H02H 7/268 |
| 2009/0034138 A1 | * | 2/2009 | Choi ..................... | H05B 41/282 361/78 |
| 2023/0187922 A1 | * | 6/2023 | Randazzo ............... | H03K 19/20 361/87 |
| 2023/0221380 A1 | * | 7/2023 | Shea ................. | G01R 19/16571 361/42 |

FOREIGN PATENT DOCUMENTS

JP  2004-173353  6/2004

* cited by examiner

*Primary Examiner* — Dharti H Patel
(74) *Attorney, Agent, or Firm* — Fish & Richardson P.C.

(57) ABSTRACT

A semiconductor device includes: a first input terminal and a second input terminal configured to be connected to both ends of a sense resistor, respectively; a square wave generation circuit configured to receive a voltage applied to the first input terminal and the second input terminal and generate a square wave signal having an amplitude proportional to a voltage across the sense resistor; a current detection signal output circuit configured to output a current detection signal according to a current flowing through the sense resistor based on the square wave signal, wherein the square wave generation circuit has a plurality of switching transistors and generates the square wave signal by controlling states of the switching transistors, and wherein a set of diodes having mutually opposite forward directions is formed in series between a back gate of each of the switching transistors and the ground.

7 Claims, 18 Drawing Sheets

SEMICONDUCTOR DEVICE

CROSS-REFERENCE TO RELATED APPLICATION

This application is based upon and claims the benefit of priority from Japanese Patent Application No. 2022-177814, filed on Nov. 7, 2022, the entire contents of which are incorporated herein by reference.

TECHNICAL FIELD

The present disclosure relates to a semiconductor device.

BACKGROUND

There is a device that detects a current flowing through a sense resistor (shunt resistor) and outputs a current detection signal indicating the detection result.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
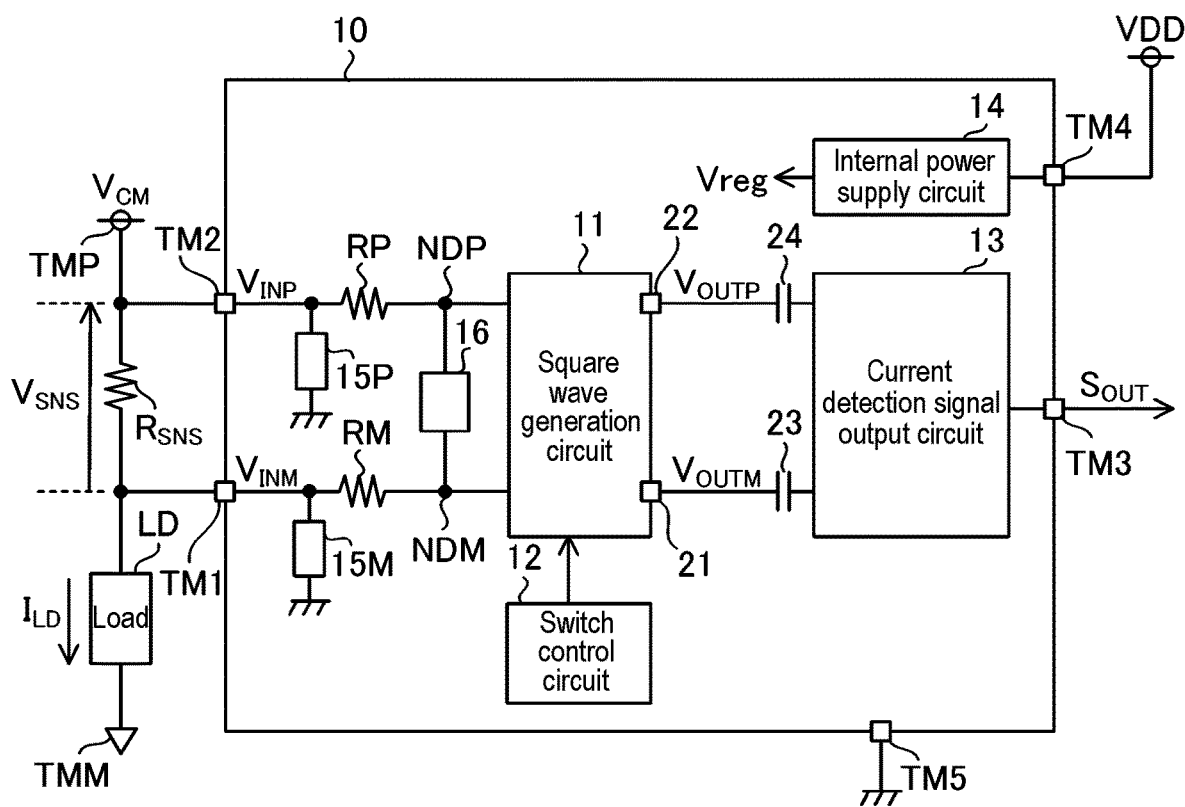
FIG. 1 is a schematic configuration diagram of a current sensor according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Examples of embodiments of the present disclosure will be specifically described below with reference to the drawings. Throughout the referred drawings, the same parts are denoted by the same reference numerals, and duplicate explanation thereof will be omitted in principle. In the present disclosure, for the sake of simplification of description, by describing a symbol or code that refers to information, a signal, a physical quantity, an element, a part, and the like, the information, the signal, the physical quantity, the element, the part, and the like corresponding to the symbol or code may be omitted or abbreviated. For example, a current detection signal output circuit (see FIG. 1) referred to by "13" to be described later may be written as a current detection signal output circuit 13, or may be abbreviated as a circuit 13. However, they all refer to the same one.

First, some terms used in the description of the embodiments of the present disclosure will be explained. A line refers to a wiring via which an electrical signal is propagated or applied. A ground refers to a reference conductive portion having a reference potential of 0 V (zero volts) or refers to the potential of 0 V itself. The reference conductive portion is formed of a conductor such as metal. The potential of 0 V may be referred to as a ground potential. In the embodiments of the present disclosure, a voltage shown without any particular reference represents a potential seen from the ground.

A level refers to a level of potential, with a high level having a higher potential than a low level for any signal or voltage of interest. For any signal or voltage of interest, strictly speaking, that the signal or voltage is at a high level means that the level of the signal or voltage is a high level, and strictly speaking, that the signal or voltage is at a low level means that the level of the signal or voltage is a low level. The level for a signal is sometimes expressed as a signal level, and the level for a voltage is sometimes expressed as a voltage level. For any signal of interest, when the signal is at a high level, the inverted signal of the signal takes a low level, and when the signal is at a low level, the inverted signal of the signal takes a high level. For any signal or voltage of interest, switching from low level to high level is called an up-edge (or rising edge) and switching from high level to low level is called a down-edge (or falling edge).

For any transistor configured as a FET (Field Effect Transistor), including a MOSFET, an on state refers to a state in which the drain and source of the transistor are electrically connected, and an off state refers to a state in which the drain and source of the transistor are electrically disconnected (cut-off state). The same also applies to transistors that are not classified as FETs. Unless otherwise specified, a MOSFET is regarded as an enhancement type MOSFET. MOSFET is an abbreviation for "metal-oxide-semiconductor field-effect transistor." Moreover, it may be considered that the back gate is short-circuited to the source in any MOSFET unless otherwise specified.

Any switch can be composed of one or more FETs (Field Effect Transistors). When a switch is in an on state, both ends of the switch are electrically connected, while when the switch is in an off state, both ends of the switch are electrically disconnected. Hereinafter, the on state and the off state of any transistor or switch may be simply expressed as on and off, respectively. For any transistor or switch, switching from an off state to an on state is expressed as turn-on, and switching from an on state to an off state is expressed as turn-off.

Further, for any transistor or switch, a period during which the transistor or switch is in an on state may be referred to as an on period, and a period during which the transistor or switch is in an off state may be referred to as an off period. For any signal having a signal level of high level or low level, a period during which the level of the signal is a high level is referred to as a high level period, and a period during which the level of the signal is a low level is referred to as a low level period. The same is also applied to any voltage that takes a voltage level of high level or low level.

A connection between a plurality of parts forming a circuit, such as arbitrary circuit elements, wirings (lines), and nodes, may be understood to refer to an electrical connection, unless otherwise specified.

FIG. 1 shows a schematic configuration diagram of a current sensor according to an embodiment of the present disclosure. The current sensor is configured to include a current detection amplifier 10 and a sense resistor $R_{SNS}$. It is also possible to adopt a way of thinking that the current detection amplifier 10 itself is a current sensor, and the current sensor 10 performs current detection using the sense resistor $R_{SNS}$. The current detection amplifier 10 includes terminals TM1 to TM5, and further includes a square wave generation circuit 11, a switch control circuit 12, a current detection signal output circuit 13, an internal power supply circuit 14, electrostatic protection circuits 15P and 15M, a clamp circuit 16, protection resistors (clamping resistors) RP and RM, terminals 21 and 22, and capacitors 23 and 24. The terminals TM1 to TM5 correspond to external terminals, and the terminals 21 and 22 correspond to internal terminals.

The current detection amplifier 10 is a semiconductor device (electronic component) that includes: a semiconductor chip having a semiconductor integrated circuit formed on a semiconductor substrate; a housing (package) that accommodates the semiconductor chip; and a plurality of external terminals exposed from the housing to the outside of the current detection amplifier 10. The semiconductor device is formed by encapsulating the semiconductor chip in the housing (package) made of resin. Circuits and circuit elements constituting the current detection amplifier 10, which includes the circuits 11 to 14, 15P, 15M, and 16, the protection resistors RP and RM, and the capacitors 23 and 24, are included in the semiconductor integrated circuit. Although only the terminals TM1 to TM5 are shown as external terminals provided in the current detection amplifier 10 in FIG. 1, external terminals other than these may also be provided in the current detection amplifier 10.

The sense resistor $R_{SNS}$ is provided outside the current detection amplifier 10. A first end of the sense resistor $R_{SNS}$ is connected to the terminal TM1, and a second end of the sense resistor $R_{SNS}$ is connected to the terminal TM2. A connection node between the terminal TM2 and the sense resistor $R_{SNS}$ is connected to a high potential end TMP to which a voltage $V_{CM}$ is applied, and therefore the voltage $V_{CM}$ is applied to the terminal TM2. The voltage $V_{CM}$ may hereinafter be referred to as a common mode voltage.

A connection node between the terminal TM1 and the sense resistor $R_{SNS}$ is connected to a first end of a load LD, and a second end of the load LD is connected to a low potential end TMM. A voltage lower than the voltage $V_{CM}$ is applied to the low potential end TMM. A current $I_{LD}$ flows from the high potential end TMP to the load LD via the sense resistor $R_{SNS}$. Thus, a voltage drop is generated across the sense resistor $R_{SNS}$ based on the current $I_{LD}$. The voltage drop generated across the sense resistor $R_{SNS}$ is referred to as a sense voltage $V_{SNS}$. A voltage ($V_{CM}$-$V_{SNS}$), which is lower than the common mode voltage $V_{CM}$ by the sense voltage $V_{SNS}$, is applied to the terminal TM1. In addition, hereinafter, a voltage at the terminal TM1 may be referred to by a symbol "$V_{INM}$," and a voltage at the terminal TM2 may be referred to by a symbol "$V_{INP}$." Typically, the low potential end TMM may be the ground, in which case the low potential end TMM has a ground potential. However, a voltage at the low potential end TMM may become a negative voltage. The common mode voltage $V_{CM}$ may become a negative voltage.

A current detection signal $S_{OUT}$, which will be described later, is output from the terminal TM3. A power supply voltage VDD is supplied to the terminal TM4. The power supply voltage VDD has a positive DC voltage value within a predetermined voltage range. The terminal TM5 is connected to the ground.

The square wave generation circuit 11 is connected to the terminal TM1 via the protection resistor RM and is also connected to the terminal TM2 via the protection resistor RP. The square wave generation circuit 11 receives the voltage $V_{INM}$ applied to the terminal TM1 via the protection resistor RM, and receives the voltage $V_{INP}$ applied to the terminal TM2 via the protection resistor RP. The square wave generation circuit 11 includes a plurality of switches, and generates a square wave signal having an amplitude proportional to the voltage across the sense resistor $R_{SNS}$ (that is, the sense voltage $V_{SNS}$) based on the voltages $V_{INP}$ and $V_{INM}$. The square wave generation circuit 11 uses the plurality of switches to output the square wave signal via the terminals 21 and 22 (details of which will be described later). The terminals 21 and 22 correspond to output terminals of the square wave generation circuit 11. Voltages applied to the terminals 21 and 22 are referred to by symbols "$V_{OUTM}$" and "$V_{OUTP}$," respectively.

The switch control circuit 12 controls a state (on/off state) of each switch in the square wave generation circuit 11.

The current detection signal output circuit 13 generates the current detection signal $S_{OUT}$ according to the current $I_{LD}$ flowing through the sense resistor $R_{SNS}$, based on the square wave signal output from the square wave generation circuit 11, and outputs the current detection signal $S_{OUT}$ from the terminal TM3 to an external circuit (not shown) of the current detection amplifier 10. The external circuit can recognize the value of the current $I_{LD}$ based on the current detection signal $S_{OUT}$. For example, the current detection signal $S_{OUT}$ is an analog signal having a voltage value proportional to the current $I_{LD}$. Alternatively, for example, the current detection signal $S_{OUT}$ may be a digital signal indicating the value of the current $I_{LD}$. The capacitor 23 is interposed between the terminal 21 and the circuit 13, and the capacitor 24 is interposed between the terminal 22 and the circuit 13. Therefore, an AC component of each of the voltages $V_{OUTM}$ and $V_{OUTP}$ is input to the circuit 13. The circuit 13 generates and outputs the current detection signal $S_{OUT}$ by amplifying an AC component of the square wave signal output from the square wave generation circuit 11.

The internal power supply circuit 14 generates one or more internal power supply voltages based on the power supply voltage VDD supplied to the terminal TM4. Each circuit in the current detection amplifier 10 can be driven based on the internal power supply voltage generated by the internal power supply circuit 14. In FIG. 1, an internal power supply voltage Vreg is shown as an example of the internal power supply voltage generated by the internal power supply circuit 14. The internal power supply voltage Vreg has a predetermined positive DC voltage value.

The electrostatic protection circuit 15M is connected between the terminal TM1 and the ground. The electrostatic protection circuit 15M protects the square wave generation circuit 11 from static electricity that may be applied to the terminal TM1 outside the current detection amplifier 10. The electrostatic protection circuit 15P is connected between the terminal TM2 and the ground. The electrostatic protection circuit 15P protects the square wave generation circuit 11 from static electricity that may be applied to the terminal TM2 outside the current detection amplifier 10.

A first end of the protection resistor RM is connected to the terminal TM1 (therefore, connected to a connection node between the electrostatic protection circuit 15M and the terminal TM1), and a second end of the protection resistor RM is connected to a node NDM. A first end of the protection resistor RP is connected to the terminal TM2 (therefore, connected to a connection node between the electrostatic protection circuit 15P and the terminal TM2), and a second end of the protection resistor RP is connected to a node NDP. The clamp circuit 16 is connected to the nodes NDP and NDM. The clamp circuit 16 works with the protection resistors RP and RM, which are also called clamping resistors, to generate a current flowing through the protection resistors RP and RM and itself when an excessive voltage is applied between the terminals TM1 and TM2, thereby suppressing a potential difference between the nodes NDP and NDM to be a predetermined clamp voltage or less. Thus, it is possible to prevent an excessive voltage from being applied to the square wave generation circuit 11.

In addition, the protection resistor RM has a function of protecting the internal circuit (including the square wave generation circuit 11) of the current detection amplifier 10 by limiting a current flowing between the terminals TM1 and NDM when a voltage which is too high or too low from the ground potential is applied to the terminal TM1. Similarly, the protection resistor RP has a function of protecting the internal circuit (including the square wave generation circuit 11) of the current detection amplifier 10 by limiting a current flowing between the terminals TM2 and NDP when a voltage which is too high or too low from the ground potential is applied to the terminal TM2.

In the following, it is assumed that the current detection amplifier 10 operates in a normal input state unless otherwise specified. In the normal input state, the voltages $V_{INP}$ and $V_{INM}$ are within a predetermined operating voltage range, and the voltage across the sense resistor $R_{SNS}$ (that is, the sense voltage $V_{SNS}$) is a predetermined allowable difference voltage or less. In the normal input state, no current substantially flows through the protection resistors RP and RM, and therefore voltages at the nodes NDM and NDP can be considered to be equal to the voltages $V_{INM}$ and $V_{INP}$, respectively.

Figure 2:
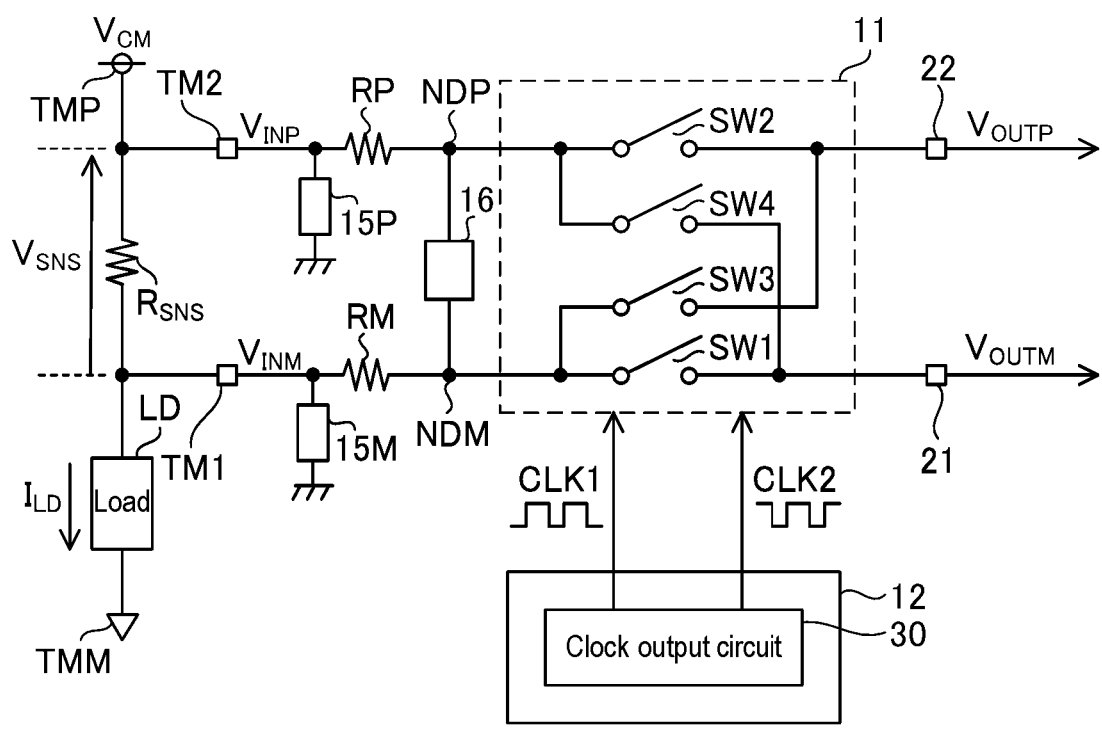
FIG. 2 is a partial configuration diagram of the current sensor of FIG. 1.

FIG. 2 shows an internal configuration of the square wave generation circuit 11. The square wave generation circuit 11 includes switches SW1 to SW4. A first end of the switch SW1 and a first end of the switch SW3 are connected in common to the node NDM. A second end of the switch SW1 is connected to the terminal 21, and a second end of the switch SW3 is connected to the terminal 22. A first end of the switch SW2 and a first end of the switch SW4 are connected in common to the node NDP. A second end of the switch SW2 is connected to the terminal 22, and a second end of the switch SW4 is connected to the terminal 21.

The switch control circuit 12 includes a clock output circuit 30. The clock output circuit 30 generates and outputs clock signals CLK1 and CLK2. Each of the clock signals CLK1 and CLK2 is a rectangular wave signal having a predetermined frequency and a predetermined amplitude. The frequencies of the clock signals CLK1 and CLK2 are the same, and the amplitudes of the clock signals CLK1 and CLK2 are also the same. However, phases of the clock signals CLK1 and CLK2 are different from each other by 180 degrees. That is, the clock signal CLK2 corresponds to an inverted signal of the clock signal CLK1 (in other words, the clock signal CLK1 corresponds to an inverted signal of the clock signal CLK2). The clock signals CLK1 and CLK2 are supplied to the square wave generation circuit 11. States (on/off states) of the switches SW1 to SW4 are individually controlled based on the clock signals CLK1 and CLK2.

Figure 3:
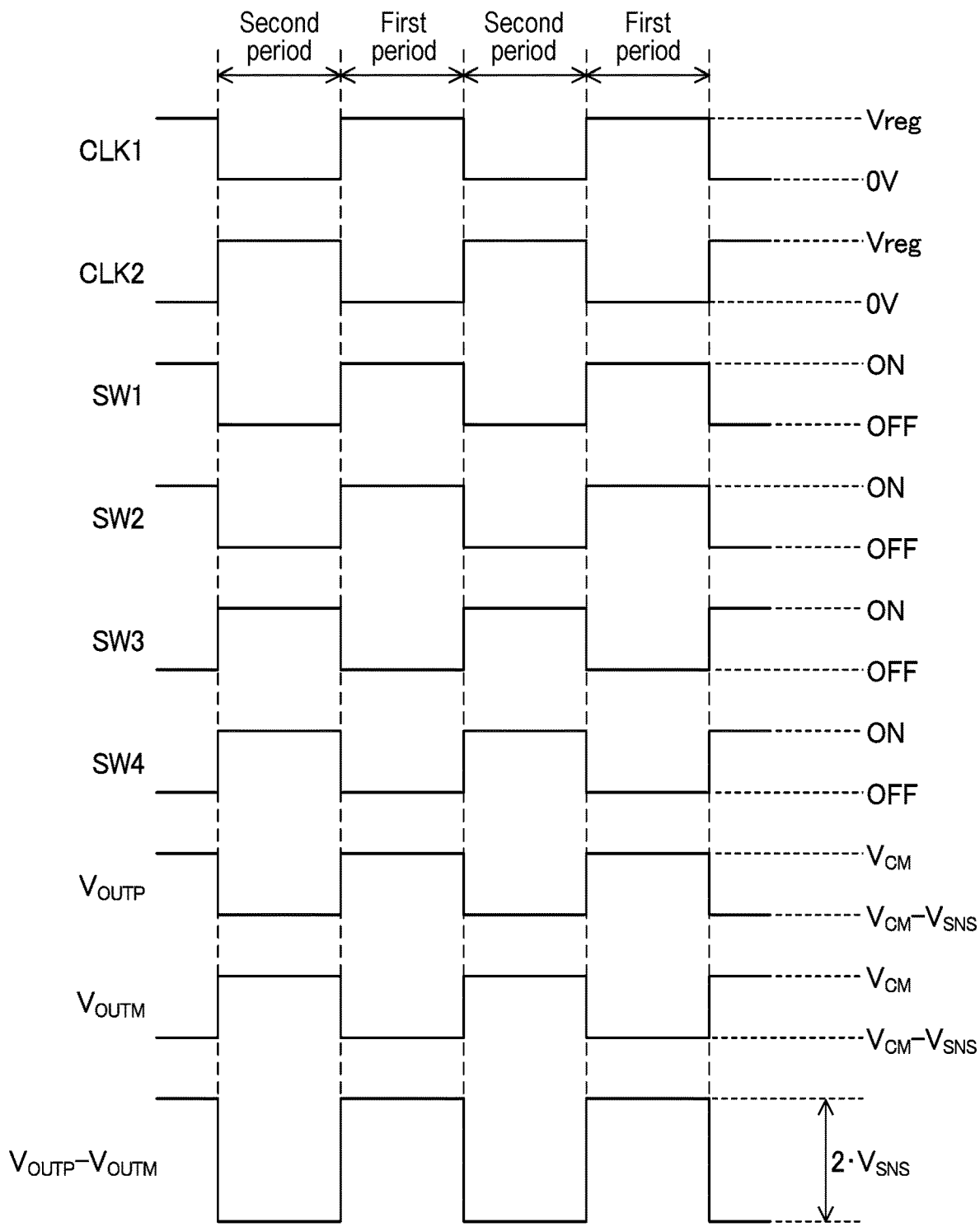
FIG. 3 is a timing chart showing relationships among two clock signals and states of four switches, and the like in the configuration of FIG. 2.

FIG. 3 shows a timing chart showing relationships among the clock signals CLK1 and CLK2 and the states of the switches SW1 to SW4. The clock signals CLK1 and CLK2 each alternately take a signal level of high level or low level. When the clock signal CLK1 is at a high level, the clock signal CLK2 is at a low level, and when the clock signal CLK1 is at a low level, the clock signal CLK2 is at a high level. Although duties of the clock signals CLK1 and CLK2 are arbitrary, it is assumed here that they are 50%.

It is assumed that in each of the clock signals CLK1 and CLK2, a high level has a potential of the voltage Vreg, and a low level has a potential of 0 V. The voltage Vreg is, for example, 4 V. Although the sense voltage $V_{SNS}$ may change moment by moment according to the current $I_{LD}$, it is assumed in FIG. 3 that the sense voltage $V_{SNS}$ is constant. In other figures and the following description, it is also assumed that the sense voltage $V_{SNS}$ is constant unless otherwise required.

A high level period of the clock signal CLK1 is referred to as a first period. The high level period of the clock signal CLK1 coincides with a low level period of the clock signal CLK2. A low level period of the clock signal CLK1 is referred to as a second period. The low level period of the clock signal CLK1 coincides with a high level period of the clock signal CLK2. After the power supply voltage VDD is started to be supplied to the current detection amplifier 10 and a predetermined startup process is performed, the first period and the second period occur alternately.

Figure 4:
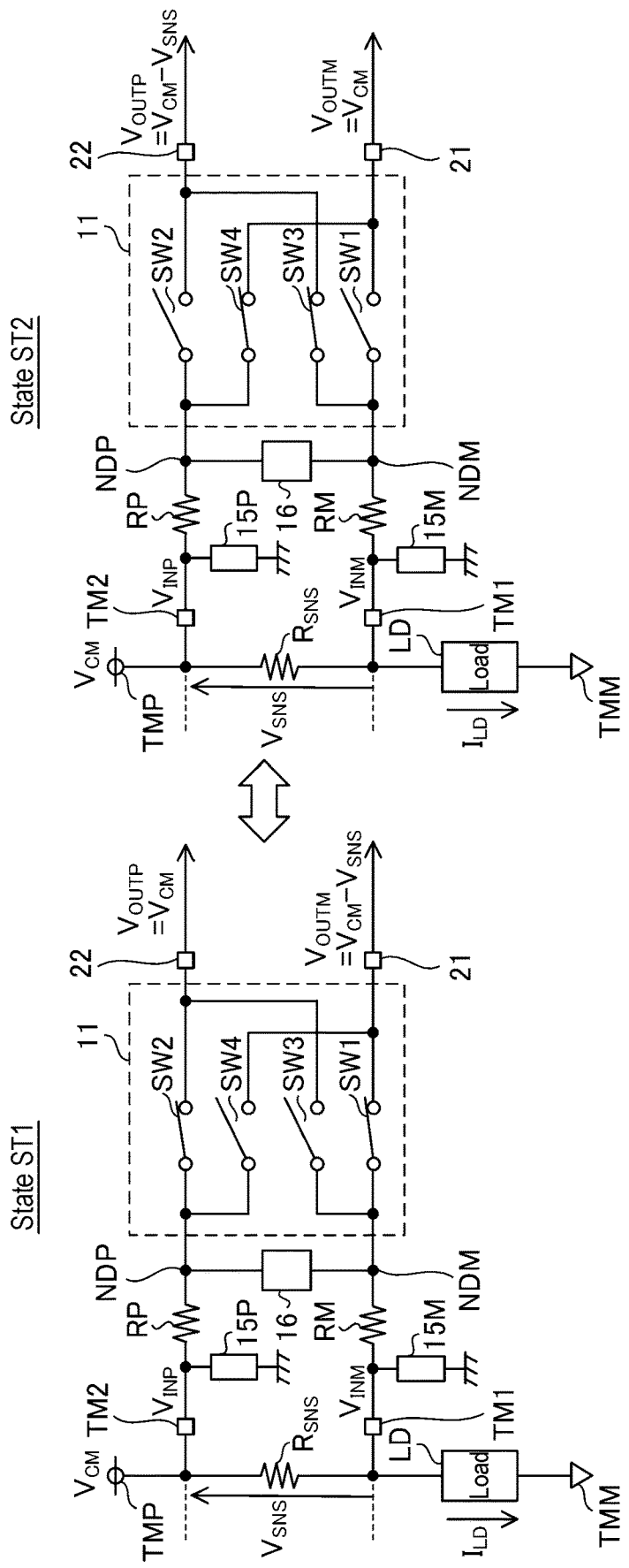
FIG. 4 is a diagram showing a state of each switch in the configuration of FIG. 2.

FIG. 4 shows states ST1 and ST2, which are two states that the square wave generation circuit 11 can take. In the first period, the state of the square wave generation circuit 11 becomes the state ST1, and in the second period, the state of the square wave generation circuit 11 becomes the state ST2. In the state ST1 (therefore in the first period), the switches SW1 and SW2 are in an on state and the switches SW3 and SW4 are in an off state. In the state ST2 (therefore in the second period), the switches SW1 and SW2 are in an off state and the switches SW3 and SW4 are in an on state. That is, the switch control circuit 12 alternately switches the state of the square wave generation circuit 11 (in other words, the states of the switches SW1 to SW4) between the states ST1 and ST2 by outputting the clock signals CLK1 and CLK2.

In the state ST1, the voltage at the node NDM, which is equal to the voltage $V_{INM}$ at the terminal TM1, is applied to the terminal 21 via the switch SW1, and the voltage at the node NDP, which is equal to the voltage $V_{INP}$ at the terminal TM2, is applied to the terminal 22 via the switch SW2. Therefore, in the state ST1, "$V_{OUTP}=VI_{NP}=V_{CM}$" and "$V_{OUTM}=V_{INM}=V_{CM}-V_{SNS}$." In the state ST2, the voltage at the node NDM, which is equal to the voltage V INM at the terminal TM1, is applied to the terminal 22 via the switch SW3, and the voltage at the node NDP, which is equal to the voltage $V_{INP}$ at the terminal TM2, is applied to the terminal 21 via the switch SW4. Therefore, in the state ST2, "$V_{OUTP}=V_{INM}=V_{CM}-V_{SNS}$s" and "$V_{OUTM}=V_{INP}=V_{CM}$."

The voltages $V_{OUTP}$ and $V_{OUTM}$ each become a rectangular wave-like pulsating voltage having an amplitude of "$V_{SNS}/2$" (a pulsating voltage having an oscillation range of $V_{SNS}$). However, phases of the voltages $V_{OUTP}$ and $V_{OUTM}$ are different from each other by 180 degrees. Therefore, a square wave signal representing a differential voltage ($V_{OUTP}-V_{OUTM}$) is generated between the terminals 21 and 22. The square wave signal representing the differential voltage ($V_{OUTP}-V_{OUTM}$) is a rectangular wave signal having an amplitude of "$V_{SNS}$" (a rectangular wave signal having an oscillation range of $2\times V_{SNS}$). The current detection signal output circuit 13 can generate the current detection signal $S_{OUT}$ according to the current $I_{LD}$ by extracting information on the sense voltage $V_{SNS}$ from the square wave signal based on the square wave signal representing the voltage difference ($V_{OUTP}-V_{OUTM}$). Note that the voltages $V_{OUTP}$ and $V_{OUTM}$ are also square wave signals. Therefore, the current detection signal output circuit 13 may be considered to generate the current detection signal $S_{OUT}$ based on the square wave signal corresponding to the voltage $V_{OUTP}$ and the square wave signal corresponding to the voltage $V_{OUTM}$.

As described above, the current detection amplifier 10 can use the sense resistor $R_{SNS}$ to detect the current $I_{LD}$ based on the square wave signal representing the differential voltage ($V_{OUTP}-V_{OUTM}$) in the normal input state. The current detection signal $S_{OUT}$ indicates the detection result of the current $I_{LD}$.

Reference Example

Figure 5:
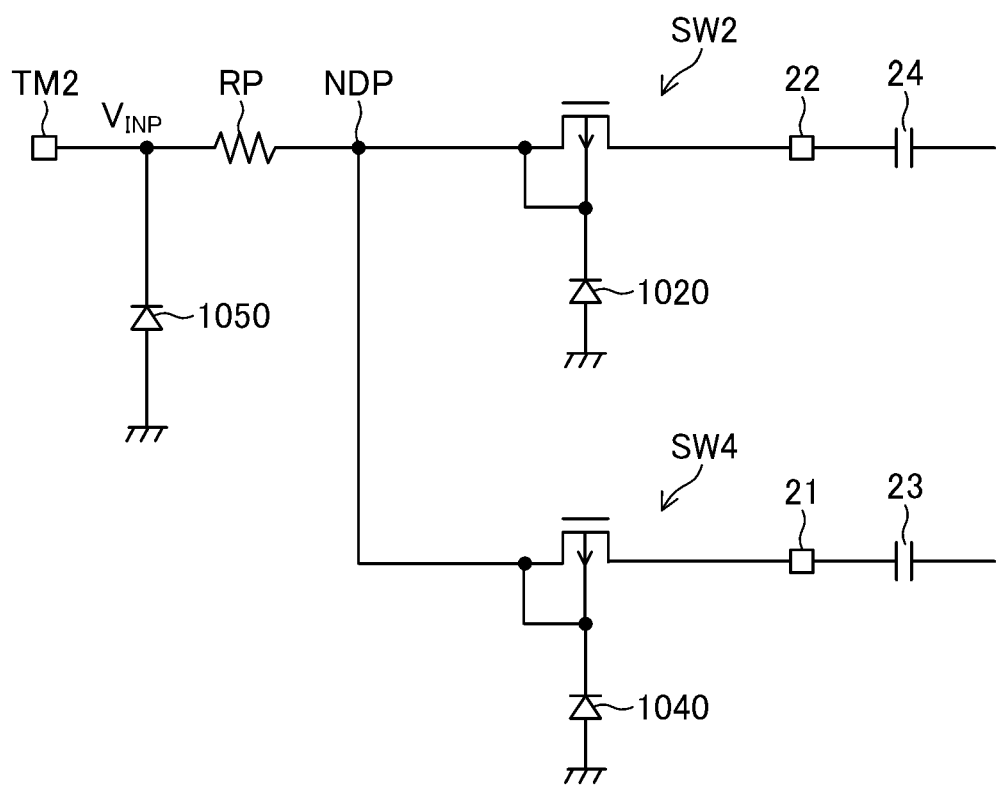
FIG. 5 is a partial configuration diagram of a current detection amplifier according to a reference example.
Figure 6:
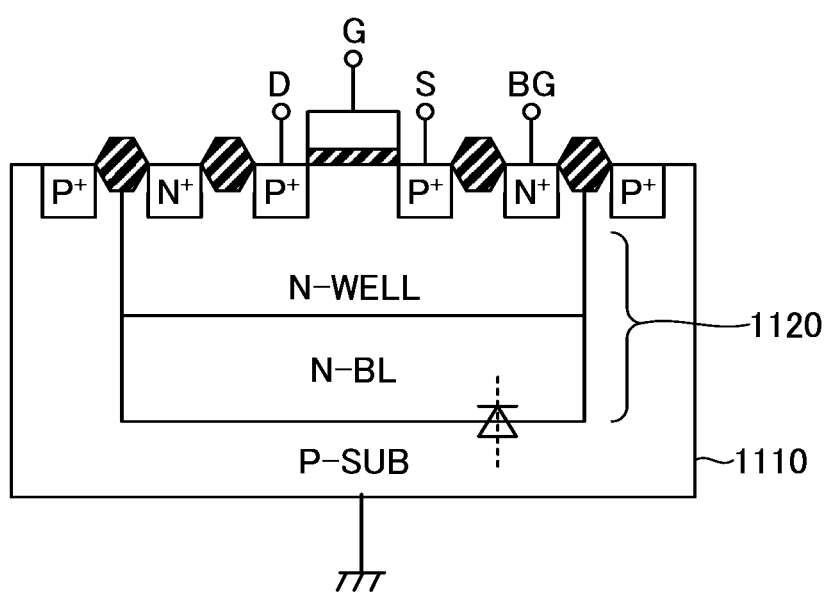
FIG. 6 is a vertical structure diagram of a transistor according to the reference example.
Figure 10:
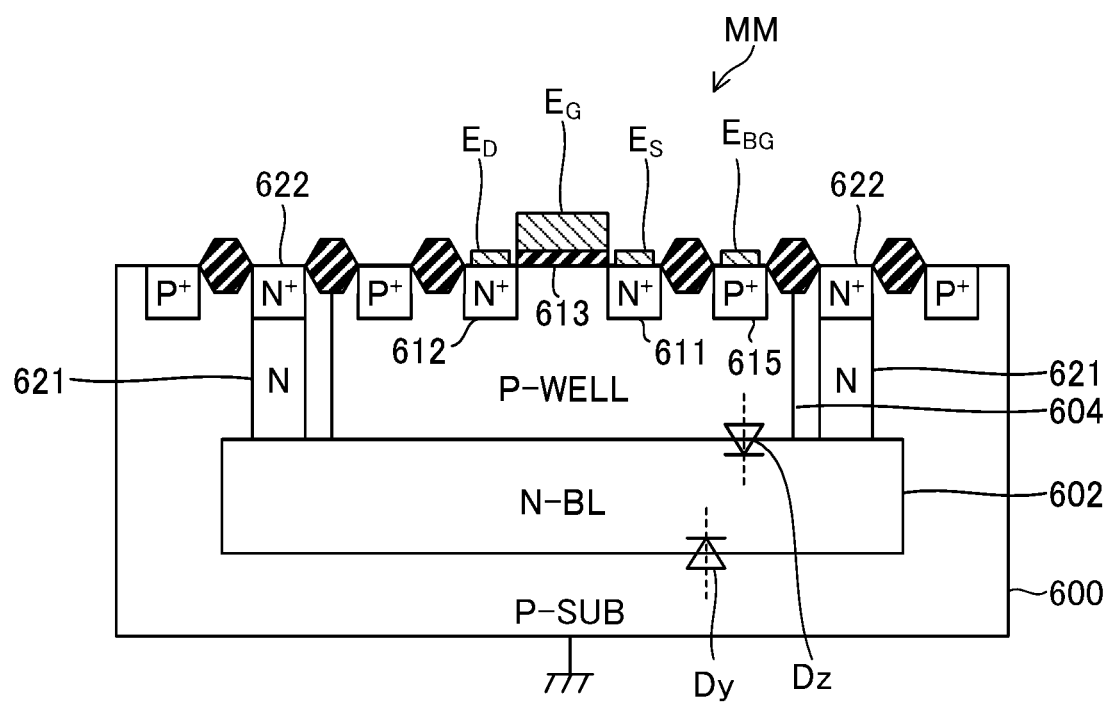
FIG. 10 is a vertical structure diagram of a transistor formed on the semiconductor substrate according to the first example belonging to the embodiment of the present disclosure.
Figure 18:
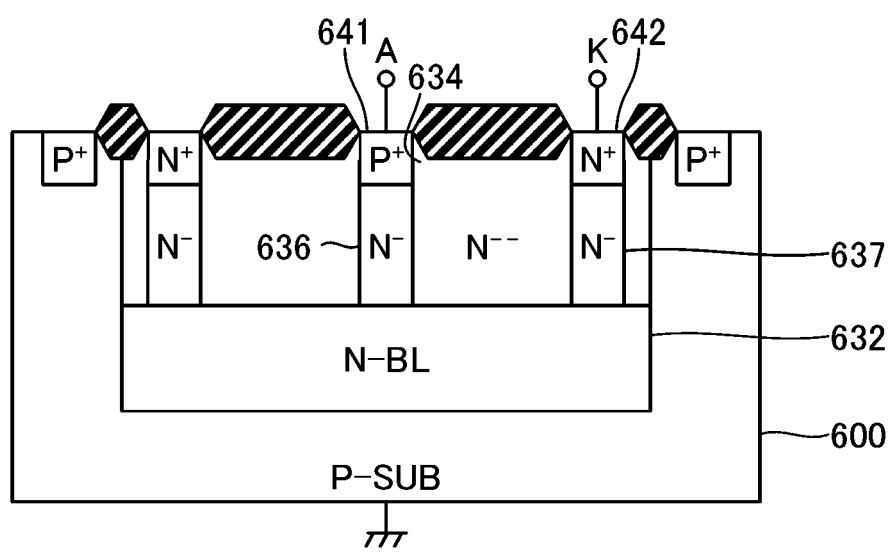
FIG. 18 is a vertical structure diagram of a Zener diode formed on a semiconductor substrate according to the second example belonging to the embodiment of the present disclosure.

FIG. 5 shows a partial configuration of a current detection amplifier 10 according to a reference example. FIG. 5 shows only switches SW2 and SW4 and elements related to the switches SW2 and SW4 in the current detection amplifier 10 according to the reference example. In the reference example, each of switches SW1 to SW4 is constituted by a P-channel type MOSFET formed on a P-type semiconductor substrate. FIG. 6 shows a vertical structure of the P-channel type MOSFET according to the reference example. A P-type semiconductor substrate 1110 is connected to the ground and has a ground potential. In the reference example, the P-channel type MOSFET is formed in an N-type semiconductor region 1120 formed in the P-type semiconductor substrate 1110, at which time a diode is formed due to a PN junction between the substrate 1110 and the region 1120. In FIG. 6 and FIGS. 10 and 18 to be described later, hatched hexagonal regions represent an oxide film formed by LOCOS (Local Oxidation of Silicon) or the like.

In FIG. 5, a diode 1020 is a diode formed in association with the switch SW2 and is a diode formed by the PN junction between the substrate 1110 and the region 1120. A diode 1040 is a diode formed in association with the switch SW4 and has the same structure as the diode 1020. In the reference example, sources of the switches SW2 and SW4 are connected to the node NDP, and drains of the switches SW2 and SW4 are connected to the terminals 22 and 21, respectively. In addition, an electrostatic protection circuit 15P according to the reference example is constituted by an electrostatic protection diode 1050 having an anode connected to the ground and a cathode connected to the terminal TM2.

Figure 7:
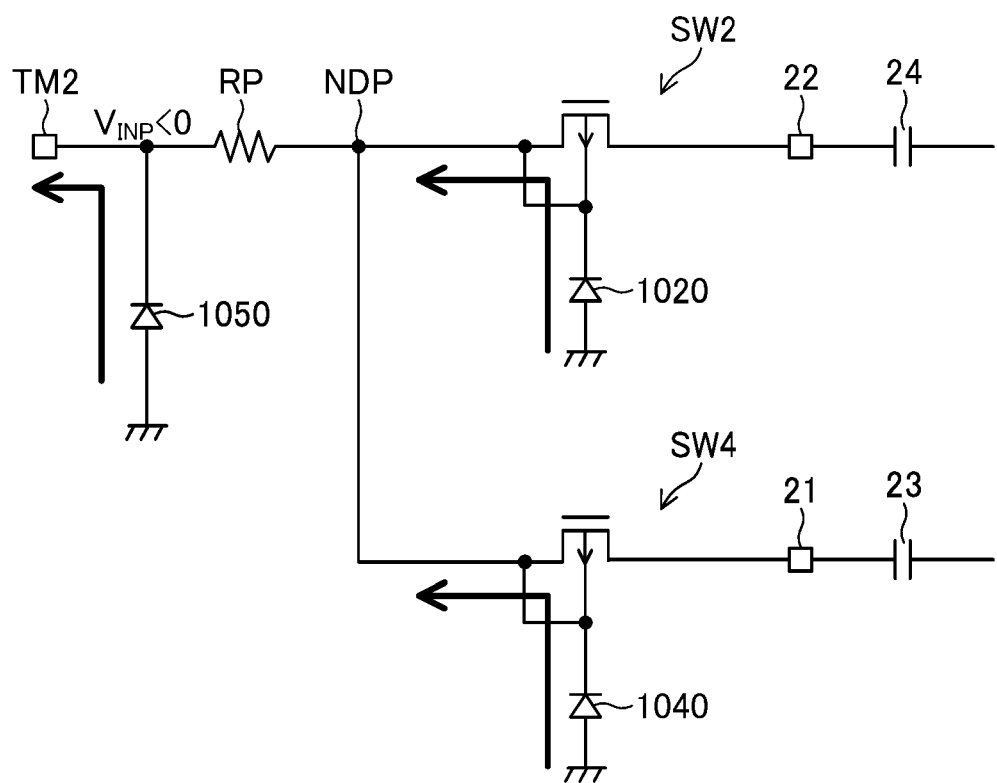
FIG. 7 is a diagram showing a state where a leakage current is generated when a negative voltage is input, according to the reference example.

When a positive voltage is applied to the terminal TM2, such as when the low potential end TMM has a ground potential, no problem occurs in the current detection amplifier 10 according to the reference example. However, when a negative voltage having a corresponding magnitude is applied to the terminal TM2, in the reference example, a leakage current flows in a forward direction in each of the diodes 1020, 1040, and 1050, as shown in FIG. 7. The leakage current flows from the ground (the P-type semiconductor substrate 1110) toward the terminal TM2. When the leakage current flows, the current $I_{LD}$ cannot be detected correctly. Although the situation in which the negative voltage is applied to the terminal TM2 has been described, the same also applies to the terminal TM1. In the reference example, a lower limit of the operating voltage range is approximately 0 V, and it is not permissible to apply a voltage lower than, for example, (−0.3 V) to the terminal TM1 or TM2.

A current detection amplifier 10 that can suppress the above-mentioned leakage current and implement accurate detection of the current $I_{LD}$ even in a situation where a negative voltage is applied to the terminal TM1 or TM2 will be described in a plurality of examples below. The matters described above in the present embodiment (excluding the matters related to the reference example) are applied to each of the following examples unless otherwise stated and unless contradictory. In each example, when there are matters that are contradictory to the above-described matters, the description in each example may take precedence. In addition, as long as there is no contradiction, the matters described in any of the following examples can be applied to any other examples (that is, it is also possible to combine any two or more of the examples).

First Example

Figure 8:
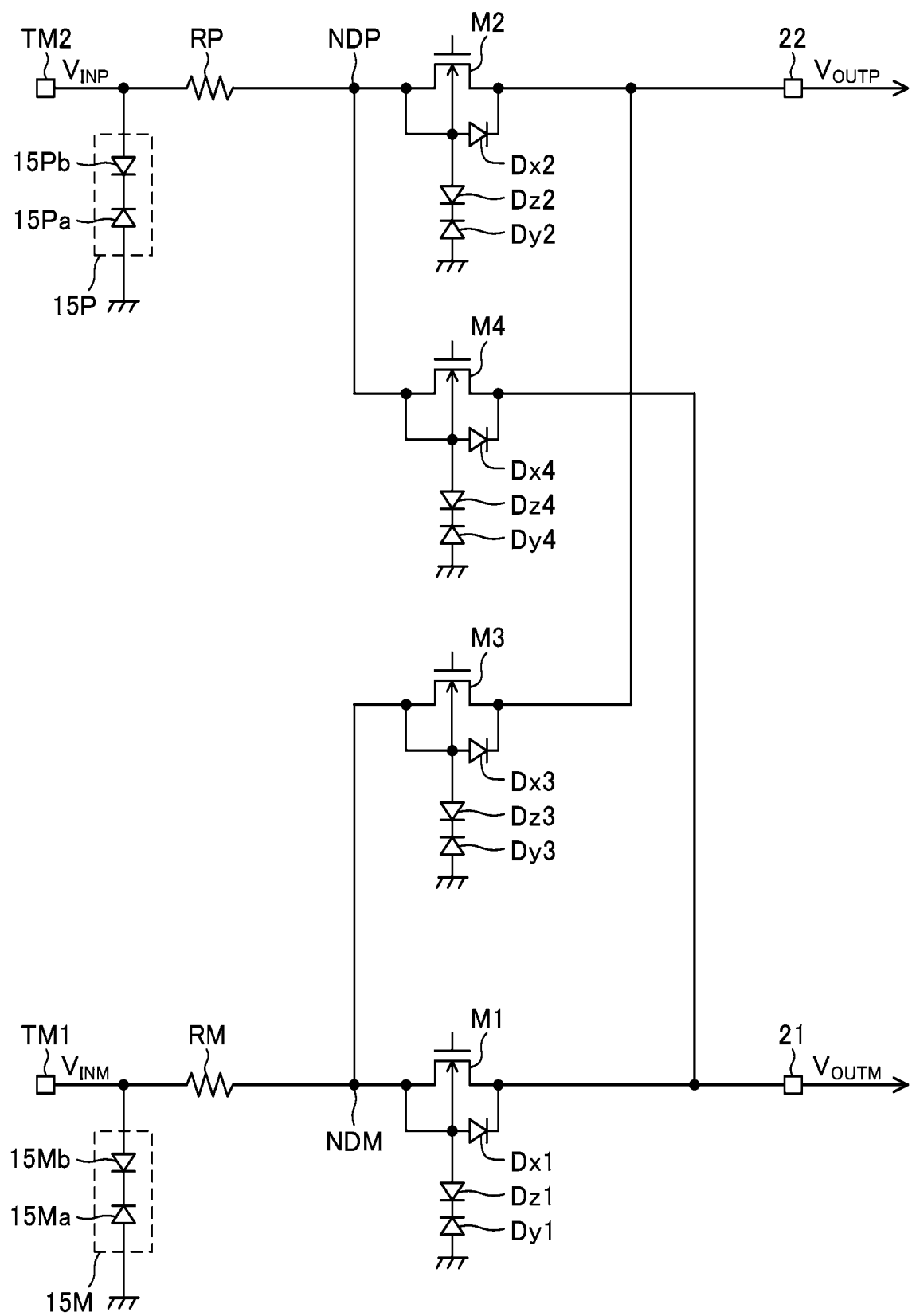
FIG. 8 is a partial configuration diagram of a current detection amplifier according to a first example belonging to the embodiment of the present disclosure.

A current detection amplifier 10 according to a first example will be explained. FIG. 8 shows a partial configuration of the current detection amplifier 10 according to the first example. In addition, the clamp circuit 16 is not shown in FIG. 8 (the same also applies to FIG. 16 to be described later).

Figure 9:
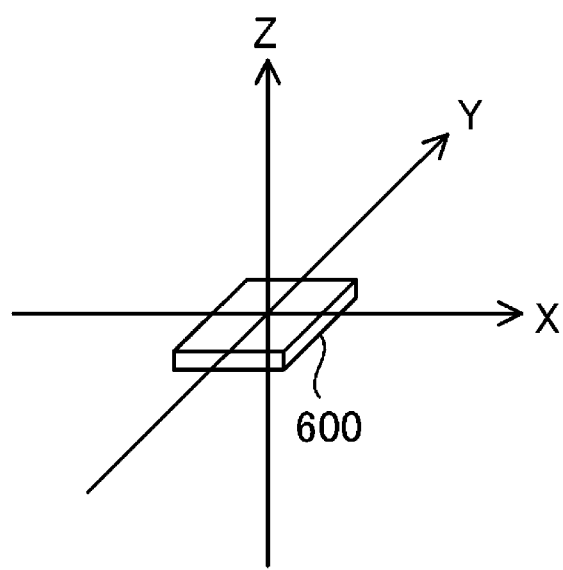
FIG. 9 is a diagram schematically showing an external shape of a semiconductor substrate according to the first example belonging to the embodiment of the present disclosure.

In the first example, transistors M1 to M4 are used as switches SW1 to SW4, respectively. The transistors M1 to M4 are N-channel type MOSFETs, respectively. The transistors M1 to M4 have the same structure. FIG. 9 shows a schematic external shape of a semiconductor substrate 600. The semiconductor substrate 600 is a P-type semiconductor substrate. The transistors M1 to M4 are formed on the semiconductor substrate 600.

For clarity of explanation, a three-dimensional orthogonal coordinate system consisting of mutually orthogonal X, Y, and Z axes is defined as shown in FIG. 9. A plane parallel to the X and Y axes is referred to as an XY plane. An arbitrary semiconductor substrate, such as the semiconductor substrate 600, has two surfaces facing each other, one of which is referred to as a main surface (or front surface) and the other as a back surface. The main surface and the back surface are parallel to the XY plane. Each element constituting the current detection amplifier 10 is formed on a main surface side of the semiconductor substrate 600. In a vertical structure of a semiconductor integrated circuit, a direction from the back surface to the main surface is considered to be upward, and the opposite direction is considered to be downward.

FIG. 10 shows a vertical structure of a transistor MM. The transistors M1 to M4 have the same structure as the transistor MM, and four transistors MM are formed as the transistors M1 to M4 on the semiconductor substrate 600. The semiconductor substrate 600 is connected to the ground and therefore has a ground potential. Each of the transistors M1 to M4 is formed as a floating MOSFET (N-channel type MOSFET) electrically insulated from the semiconductor substrate 600. Therefore, even when a negative voltage is applied to the terminals TM1 and TM2, no current flows between the ground and back gates of the transistors M1 to M4.

The above will be explained more specifically. Referring to FIG. 8, a source of each of the transistors M1 and M3 is connected to the node NDM. The source of each of the transistors M2 and M4 is connected to the node NDP. A drain of each of the transistors M1 and M4 is connected to the terminal 21. The drain of each of the transistors M2 and M3 is connected to the terminal 22. In each of the transistors M1 to M4, since there is a PN junction between the back gate and the drain, when using the back gate shorted to the source, a parasitic diode Dx having a forward direction from the source to the drain is added (assuming here that the back gate and source are actually shorted). The parasitic diodes Dx of the transistors M1, M2, M3, and M4 are specifically referred to as parasitic diodes Dx1, Dx2, Dx3, and Dx4, respectively.

In the current detection amplifier 10, a set of diodes Dy and Dz is provided between the back gate of each of the transistors M1 to M4 and the ground. The diodes Dy and Dz have mutually opposite forward directions. The diodes Dy and Dz provided for the transistor M1 are specifically referred to as diodes Dy1 and Dz1, respectively. The diodes Dy and Dz provided for the transistor M2 are specifically referred to as diodes Dy2 and Dz2, respectively. The diodes Dy and Dz provided for the transistor M3 are specifically referred to as diodes Dy3 and Dz3, respectively. The diodes Dy and Dz provided for the transistor M4 are specifically referred to as diodes Dy4 and Dz4, respectively.

Regarding the transistor M1, the source and back gate of the transistor M1 are connected to an anode of each of the diodes Dx1 and Dz1, and a cathode of the diode Dx1 is connected to the drain of the transistor M1. In addition, a cathode of the diode Dz1 is connected to a cathode of the diode Dy1, and an anode of the diode Dy1 is connected to the ground.

Regarding the transistor M2, the source and back gate of the transistor M2 are connected to an anode of each of the diodes Dx2 and Dz2, and a cathode of the diode Dx2 is connected to the drain of the transistor M2. In addition, a cathode of the diode Dz2 is connected to a cathode of the diode Dy2, and an anode of the diode Dy2 is connected to the ground.

Regarding the transistor M3, the source and back gate of the transistor M3 are connected to an anode of each of the diodes Dx3 and Dz3, and a cathode of the diode Dx3 is connected to the drain of the transistor M3. In addition, a cathode of the diode Dz3 is connected to a cathode of the diode Dy3, and an anode of the diode Dy3 is connected to the ground.

Regarding the transistor M4, the source and back gate of the transistor M4 are connected to an anode of each of the diodes Dx4 and Dz4, and a cathode of the diode Dx4 is connected to the drain of the transistor M4. In addition, a cathode of the diode Dz4 is connected to a cathode of the diode Dy4, and an anode of the diode Dy4 is connected to the ground.

In addition, the electrostatic protection circuit 15P is constituted by a series circuit of an electrostatic protection diode 15Pa and a backflow prevention diode 15Pb. The series circuit of diodes 15Pa and 15Pb is connected between the terminal TM2 and the ground, and the diodes 15Pa and 15Pb have mutually opposite forward directions. Specifically, an anode of the electrostatic protection diode 15Pa is connected to the ground, an anode of the backflow prevention diode 15Pb is connected to the terminal TM2, and cathodes of the diodes 15Pa and 15Pb are connected to each other. The arrangement positions of the diodes 15Pa and 15Pb may be reversed.

Similarly, the electrostatic protection circuit 15M is constituted by a series circuit of an electrostatic protection diode 15Ma and a backflow prevention diode 15Mb. The series circuit of diodes 15Ma and 15Mb is connected between the terminal TM1 and the ground, and the diodes 15Ma and 15Mb have mutually opposite forward directions. Specifically, an anode of the electrostatic protection diode 15Ma is connected to the ground, an anode of the backflow prevention diode 15Mb is connected to the terminal TM1, and cathodes of the diodes 15Ma and 15Mb are connected to each other. The arrangement positions of the diodes 15Ma and 15Mb may be reversed.

Referring to FIG. 10, the semiconductor substrate 600, which is a P-type semiconductor substrate, is connected to the ground and therefore has a ground potential. In FIG. 10, hatched hexagonal regions represent an oxide film formed by LOCOS (Local Oxidation of Silicon) or the like. A buried layer 602 is formed on the main surface side of the semiconductor substrate 600. The buried layer 602 is an N-type semiconductor region. The buried layer 602 may be an $N^+$ semiconductor region. In the semiconductor substrate 600, a P-type well 604, which is a P-type semiconductor region, is formed above the buried layer 602. The transistor MM is formed in the P-type well 604. The transistor MM has a source region 611 and a drain region 612, which are N-type semiconductor regions ($N^+$ diffusion regions), and a back gate region 615 which is a P-type semiconductor region ($P^+$ diffusion region). The source region 611, the drain region 612, and the back gate region 615 are formed at positions spaced apart from one another in the well 604. The transistor MM further has a gate oxide film 613 formed on a region located between the source region 611 and the drain region 612 in the P-type well 604, and a gate electrode $E_G$ formed on the gate oxide film 613. The gate electrode $E_G$ corresponds to a gate of the transistor MM.

The source region 611, the drain region 612, and the back gate region 615 are exposed on an upper side of the semiconductor substrate 600. On the upper side of the semiconductor substrate 600, the source region 611, the drain region 612, and the back gate region 615 are connected to a source electrode $E_S$, a drain electrode $E_D$, and a back gate electrode $E_{BG}$, respectively. The source region 611 and the source electrode $E_S$ constitute a source of the transistor MM. The drain region 612 and the drain electrode $E_D$ constitute a drain of the transistor MM. A back gate of transistor MM includes the back gate region 615 and the back gate electrode $E_{BG}$. It may be understood that the P-type semiconductor region (corresponding to a part of the well 604) located between the back gate region 615 and the buried layer 602 is also included in components of the back gate of the transistor MM.

A diode Dy is a diode formed by a PN junction between the P-type semiconductor substrate 600 and the N-type buried layer 602. The P-type back gate region 615 is directly connected to the P-type well 604. A diode Dz is a diode formed by a PN junction between the P-type semiconductor region, which consists of the back gate region 615 and the well 604, and the N-type buried layer 602.

An N-type well 621 and an N-type diffusion region 622 (N+ diffusion region) are formed at positions surrounding the P-type well 604. The well 621 is formed in a region above the buried layer 602 at a position where the well 604 is not provided, and the diffusion region 622 is formed on the well 621. The diffusion region 622 is exposed on the upper side. By applying the highest potential within the current detection amplifier 10 to the diffusion region 622, it is possible to apply the highest potential to the buried layer 602. However, the buried layer 602 may be open together with the diffusion region 622 and the well 621 (it is not necessary to apply a fixed potential to the buried layer 602).

In addition, a plurality of elements formed on the semiconductor substrate 600 and a plurality of regions provided on the semiconductor substrate 600 are separated by a PN junction isolation or insulator isolation technique as appropriate. The insulator isolation is implemented using an oxide film formed by LOCOS or the like. The details of these isolations are well-known matters and will not be explained here (the same also applies to the explanation regarding the structure of FIG. 18 to be shown later).

In the first example, the set of diodes Dy and Dz is formed for each of the transistors M1 to M4, so that even when a negative voltage is applied to the terminal TM1 or TM2, no leakage current is generated from the semiconductor substrate 600 toward the terminal TM1 or TM2 via the node NDM or NDP. In addition, by using the electrostatic protection circuits 15M and 15P shown in FIG. 8, a leakage current through the electrostatic protection circuits 15M and 15P is also not generated when the negative voltage is applied to the terminal TM1 or TM2. Therefore, even when the negative voltage is applied to the terminal TM1 or TM2, the current $I_{LD}$ can be detected correctly.

Figure 11:
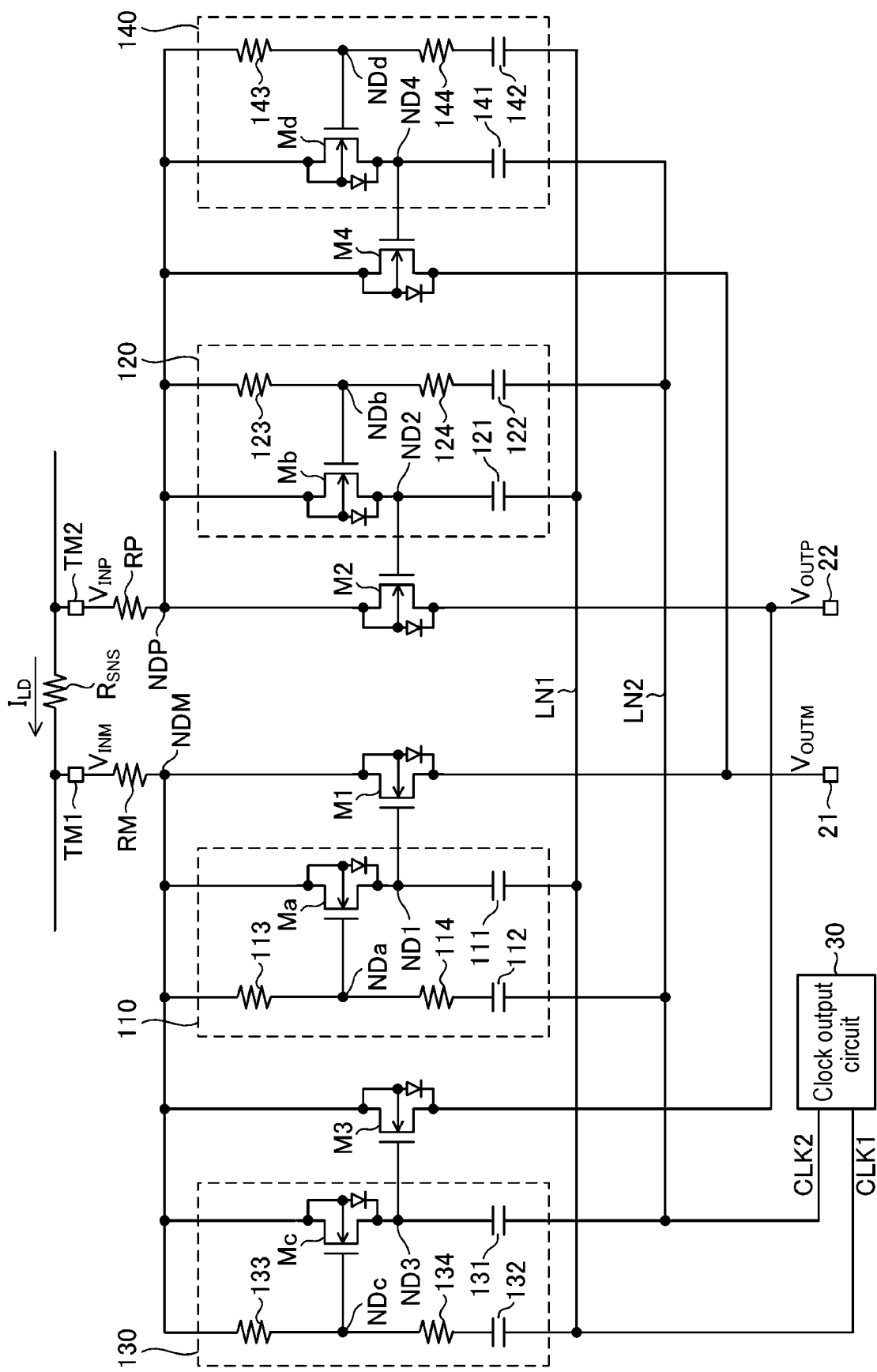
FIG. 11 is a detailed circuit diagram of a part of a current sensor according to the first example belonging to the embodiment of the present disclosure.

FIG. 11 shows a detailed circuit example of a part of the current detection amplifier 10. The electrostatic protection circuits 15P and 15M and the clamp circuit 16 are not shown in FIG. 11. The switch control circuit 12 (see FIG. 2) includes gate signal generation circuits 110 to 140 in addition to the clock output circuit 30. The clock signal CLK1 output from the clock output circuit 30 is applied to a clock line LN1, and the clock signal CLK2 output from the clock output circuit 30 is applied to a clock line LN2. It may be understood that the clock lines LN1 and LN2 are also included in components of the switch control circuit 12.

The gate signal generation circuits 110 to 140 generate gate signals for the transistors M1 to M4, respectively. The gate signal generation circuits 110 to 140 have a common configuration. Specifically, the gate signal generation circuit 110 includes a transistor Ma, capacitors 111 and 112, and resistors 113 and 114. The gate signal generation circuit 120 includes a transistor Mb, capacitors 121 and 122, and resistors 123 and 124. The gate signal generation circuit 130 includes a transistor Mc, capacitors 131 and 132, and resistors 133 and 134. The gate signal generation circuit 140 includes a transistor Md, capacitors 141 and 142, and resistors 143 and 144.

The transistors M1 to M4 can be considered to function as switching transistors or main transistors, in which case the transistors Ma to Md can be considered to function as control transistors or sub-transistors. The transistors Ma to Md are N-channel type MOSFETs, each of which has the same structure as the transistor MM. Therefore, although not particularly shown, a set of diodes Dy and Dz having mutually opposite forward directions is formed between a back gate of the transistor Ma and the ground. Similarly, a set of diodes Dy and Dz having mutually opposite forward directions is formed between a back gate of the transistor Mb and the ground. The same also applies to the transistors Mc and Md. A parasitic diode (corresponding to the above-mentioned parasitic diode Dx) added between the source and drain of each of the transistors M1 to M4 and Ma to Md is shown in FIG. 11, but a description of using the diodes Dy and Dz is omitted.

A gate threshold voltage (for example, 0.6 V) of each of the transistors M1 to M4 and Ma to Md is lower than the internal power supply voltage Vreg (for example, 4 V). Therefore, for example, when a gate potential of the transistor M1 is higher by the voltage Vreg than a source potential of the transistor M1, the transistor M1 is in an on state. The same also applies to the transistors M2 to M4 and Ma to Md. In addition, a resistance value of each of the resistors 113, 114, 123, 124, 133, 134, 143, and 144 is sufficiently larger than a resistance value of each of the protection resistors RP and RM.

Connection relationships among circuit elements shown in FIG. 11 will be explained.

The source of the transistor M1 is connected to the node NDM, and the drain of the transistor M1 is connected to the terminal 21. The source of the transistor Ma is connected to the node NDM, and the drain of the transistor Ma is connected to a node ND1. The node ND1 is connected to the gate of the transistor M1 and a first end of the capacitor 111. A second end of the capacitor 111 is connected to the clock line LN1. The gate of the transistor Ma is connected to a node NDa. A first end of the capacitor 112 is connected to the node NDa via the resistor 114, and a second end of the capacitor 112 is connected to the clock line LN2. In addition, the node NDa is connected to the node NDM via the resistor 113.

The source of the transistor M2 is connected to the node NDP, and the drain of the transistor M2 is connected to the terminal 22. The source of the transistor Mb is connected to the node NDP, and the drain of the transistor Mb is connected to a node ND2. The node ND2 is connected to the gate of the transistor M2 and a first end of the capacitor 121. A second end of the capacitor 121 is connected to the clock line LN1. The gate of the transistor Mb is connected to a node NDb. A first end of the capacitor 122 is connected to the node NDb via the resistor 124, and a second end of the capacitor 122 is connected to the clock line LN2. In addition, the node NDb is connected to the node NDP via the resistor 123.

The source of the transistor M3 is connected to the node NDM, and the drain of the transistor M3 is connected to the terminal 22. The source of the transistor Mc is connected to the node NDM, and the drain of the transistor Mc is connected to a node ND3. The node ND3 is connected to the gate of the transistor M3 and to a first end of the capacitor 131. A second end of the capacitor 131 is connected to the clock line LN2. The gate of the transistor Mc is connected to a node NDc. A first end of the capacitor 132 is connected to the node NDc via the resistor 134, and a second end of the capacitor 132 is connected to the clock line LN1. In addition, the node NDc is connected to the node NDM via the resistor 133.

The source of the transistor M4 is connected to the node NDP, and the drain of the transistor M4 is connected to the terminal 21. The source of the transistor Md is connected to the node NDP, and the drain of the transistor Md is connected to a node ND4. The node ND4 is connected to the gate of the transistor M4 and a first end of the capacitor 141. A second end of the capacitor 141 is connected to the clock line LN2. The gate of the transistor Md is connected to a node NDd. A first end of the capacitor 142 is connected to the node NDd via the resistor 144, and a second end of the capacitor 142 is connected to the clock line LN1. In addition, the node NDd is connected to the node NDP via the resistor 143.

Figure 12:
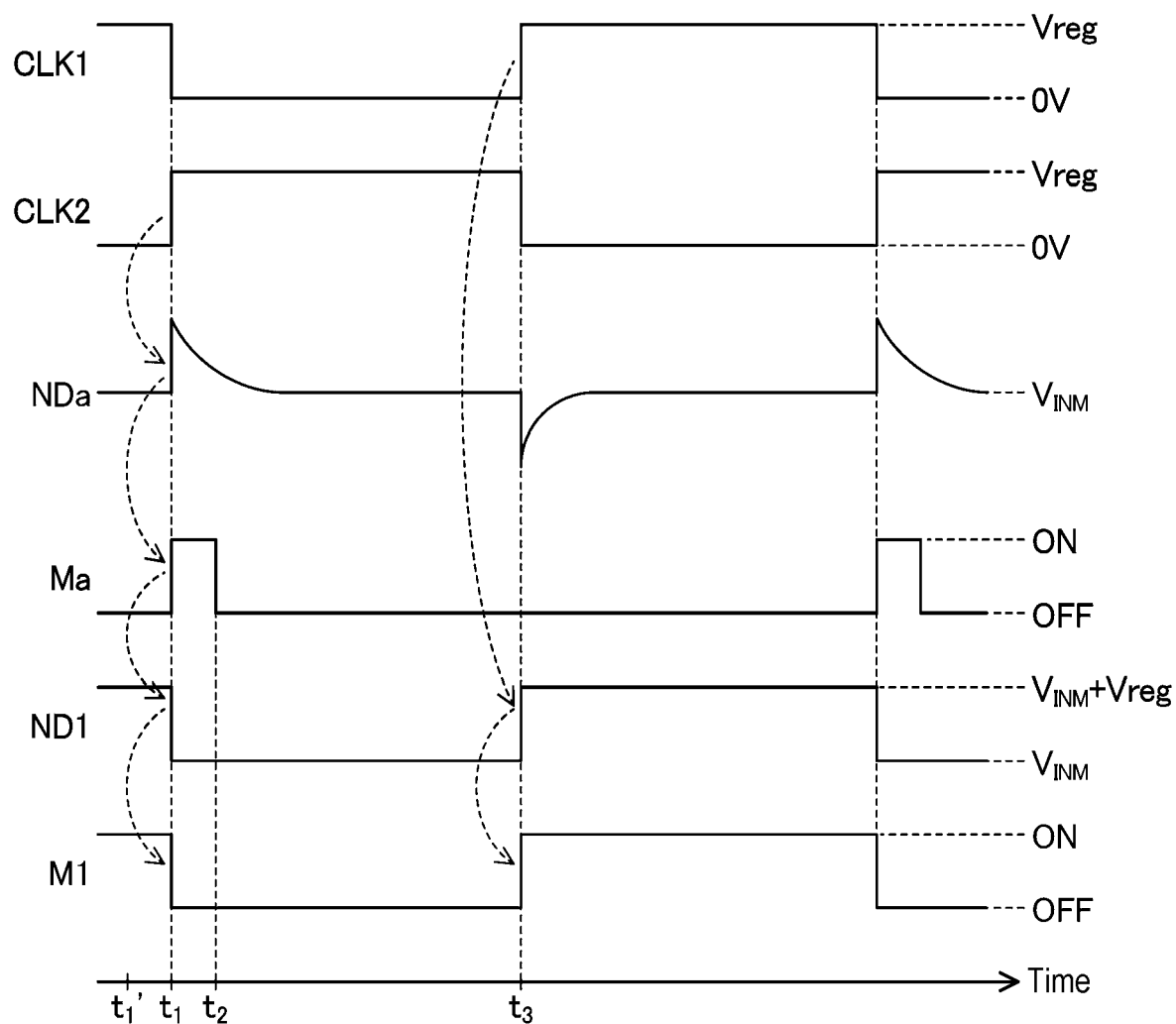
FIG. 12 is a timing chart related to the circuit of FIG. 11.

Operations of the transistor M1 and the gate signal generation circuit 110 will be described with reference to FIG. 12. The operations will be described starting from time $t_1'$. Time $t_1'$ is a time during the high level period of the clock signal CLK1, and is a time immediately before a down-edge of the clock signal CLK1. At time $t_1'$, since a voltage at the node NDa is equal to the voltage $V_{INM}$, the transistor Ma is in an off state. At time $t_1'$, since a voltage at the node ND1 is equal to a voltage ($V_{INM}$+Vreg), the transistor M1 is in an on state. The voltage ($V_{INM}$+Vreg) refers to a voltage higher by the voltage Vreg than the voltage $V_{INM}$.

At time $t_1$ after time $t_1'$, a down-edge occurs in the clock signal CLK1 and an up-edge occurs in the clock signal CLK2.

At time $t_1$, a level change of the clock signal CLK2 is transmitted to the node NDa via the capacitor 112, so that the voltage at the node NDa rises above the voltage $V_{INM}$. The transistor Ma is turned on due to the rise in the voltage at the node NDa at time $t_1$. At time $t_1$, the transistor Ma is turned on, and a level change of the clock signal CLK1 is transmitted to the node ND1 via the capacitor 111. Therefore, at time $t_1$, the voltage at the node ND1 decreases from the voltage ($V_{INM}$+Vreg) to the voltage at the node NDM (therefore, the voltage $V_{INM}$ at the terminal TM1), and as a result, the transistor M1 is turned off.

After time $t_1$, a current flows from the node NDa to the terminal TM1 via the resistor 113, so that a potential of the node NDa decreases, and at time $t_2$, a gate-source voltage of the transistor Ma becomes lower than a gate threshold voltage of the transistor Ma, so that the transistor Ma is turned off. It is assumed that a time difference between times $t_1$ and $t_2$ is shorter than half of one cycle of the clock signal CLK1 or CLK2 (a capacitance value of the capacitor 112 and resistance values of the resistors 113 and 114 are set so as to meet this condition).

Time $t_3$ is a time when half of one cycle of the clock signal CLK1 or CLK2 has elapsed from time $t_1$. After time $t_1$, the voltage at the node ND1 immediately before time $t_3$ substantially matches the voltage $V_{INM}$. At time $t_3$, an up-edge occurs in the clock signal CLK1 and a down-edge occurs in the clock signal CLK2. A level change of the clock signal CLK1 at time $t_3$ is transmitted to the node ND1 via the capacitor 111. Then, at time $t_3$, since the voltage at the node ND1 rises from the voltage $V_{INM}$ to the voltage ($V_{INM}$+Vreg), the transistor M1 is turned on. Thereafter, the transistor M1 is maintained in the on state until a next down-edge occurs in the clock signal CLK1. In addition, during the high level period of the clock signal CLK1, the voltage of the node ND1 may actually fluctuate slightly and transiently from the voltage ($V_{INM}$+Vreg).

As a level change of the clock signal CLK2 at time $t_3$ is transmitted to the node NDa via the capacitor 112, the voltage at the node NDa temporarily drops below the voltage $V_{INM}$, but this drop does not affect the state of the transistor Ma. That is, after time $t_2$, the transistor Ma is maintained in the off state until a next up-edge occurs in the clock signal CLK2. Thereafter, every time an up-edge occurs in the clock signal CLK2, a circuit operation similar to the circuit operations at times $t_1$ and $t_2$ is performed, and every time an up-edge occurs in the clock signal CLK1, a circuit operation similar to the circuit operation at time $t_3$ is performed.

Figure 14:
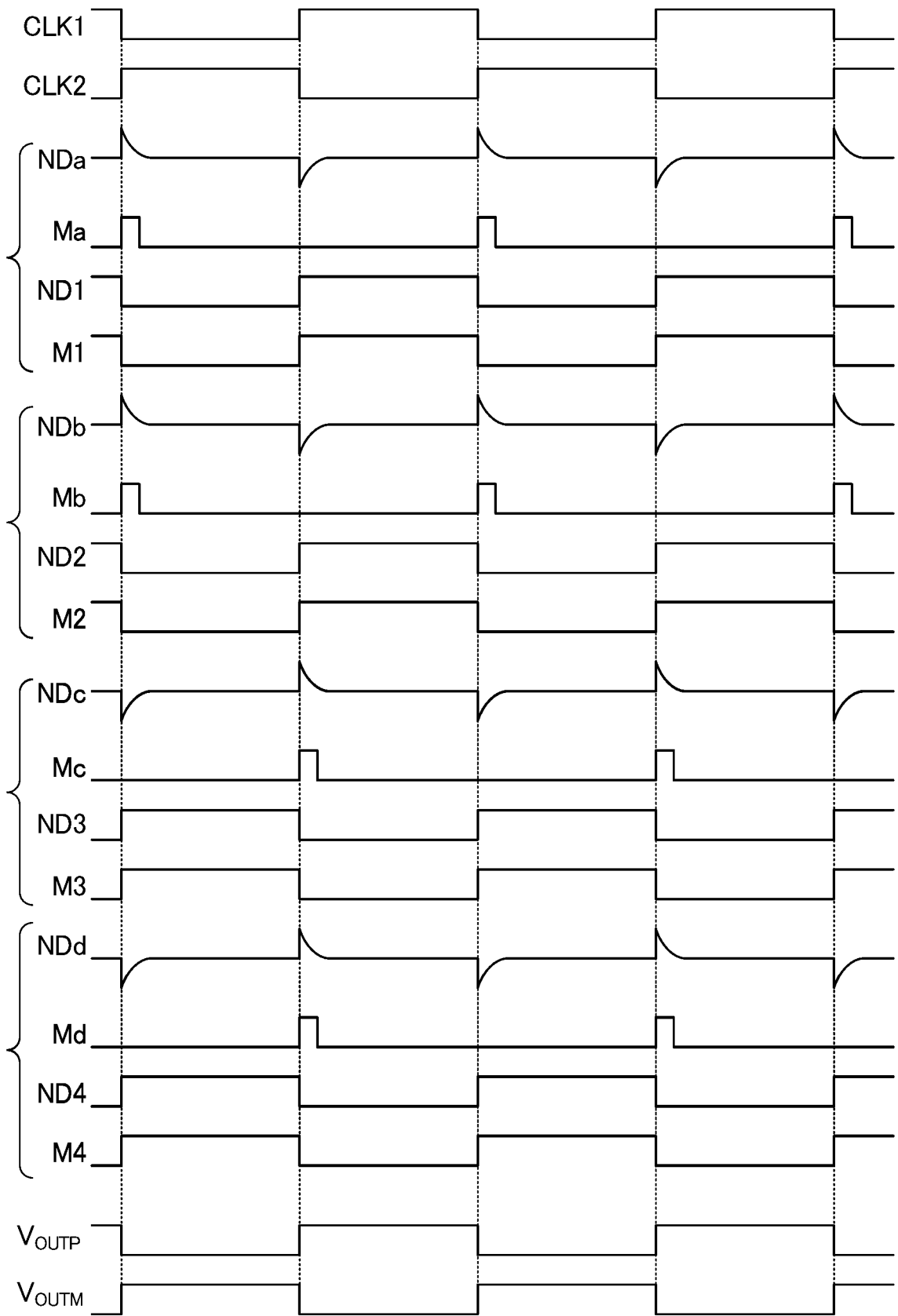
FIG. 14 is a timing chart related to the circuit of FIG. 11.

Operations of the transistor M2 and the gate signal generation circuit 120 are similar to the operations of the transistor M1 and the gate signal generation circuit 110 (see FIG. 14). Symbols "M1," "Ma," "111," "112," "113," "114," "ND1," "NDa," "TM1," "$V_{INM}$," and "NDM" in the explanation of the operations of the transistor M1 and the gate signal generation circuit 110 may be read as symbols "M2," "Mb," "121," "122," "123," "124," "ND2" "NDb," "TM2," "$V_{INP}$," and "NDP" in the explanation of the operations of the transistor M2 and the gate signal generation circuit 120, respectively. An on period of the transistor M1 matches an on period of the transistor M2. During the on period of the transistor M1, "$V_{OUTM}=V_{INM}$," and during the on period of the transistor M2, "$V_{OUTP}=V_{INP}$."

As described above, at the timing ($t_1$) of the up-edge of the clock signal CLK2, the level change of the clock signal CLK2 is transmitted to the gates of the transistors Ma and Mb via the capacitors 112 and 122, respectively, so that the transistors Ma and Mb are turned on. As a result, the transistors M1 and M2 are turned off. Thereafter, through the turn-off of the transistors Ma and Mb (through $t_2$), the level change of the clock signal CLK1 is transmitted to the gates of the transistors M1 and M2 via the capacitors 111 and 121, respectively, at the timing ($t_3$) of the up-edge of the clock signal CLK1, thereby turning on the transistors M1 and M2.

Figure 13:
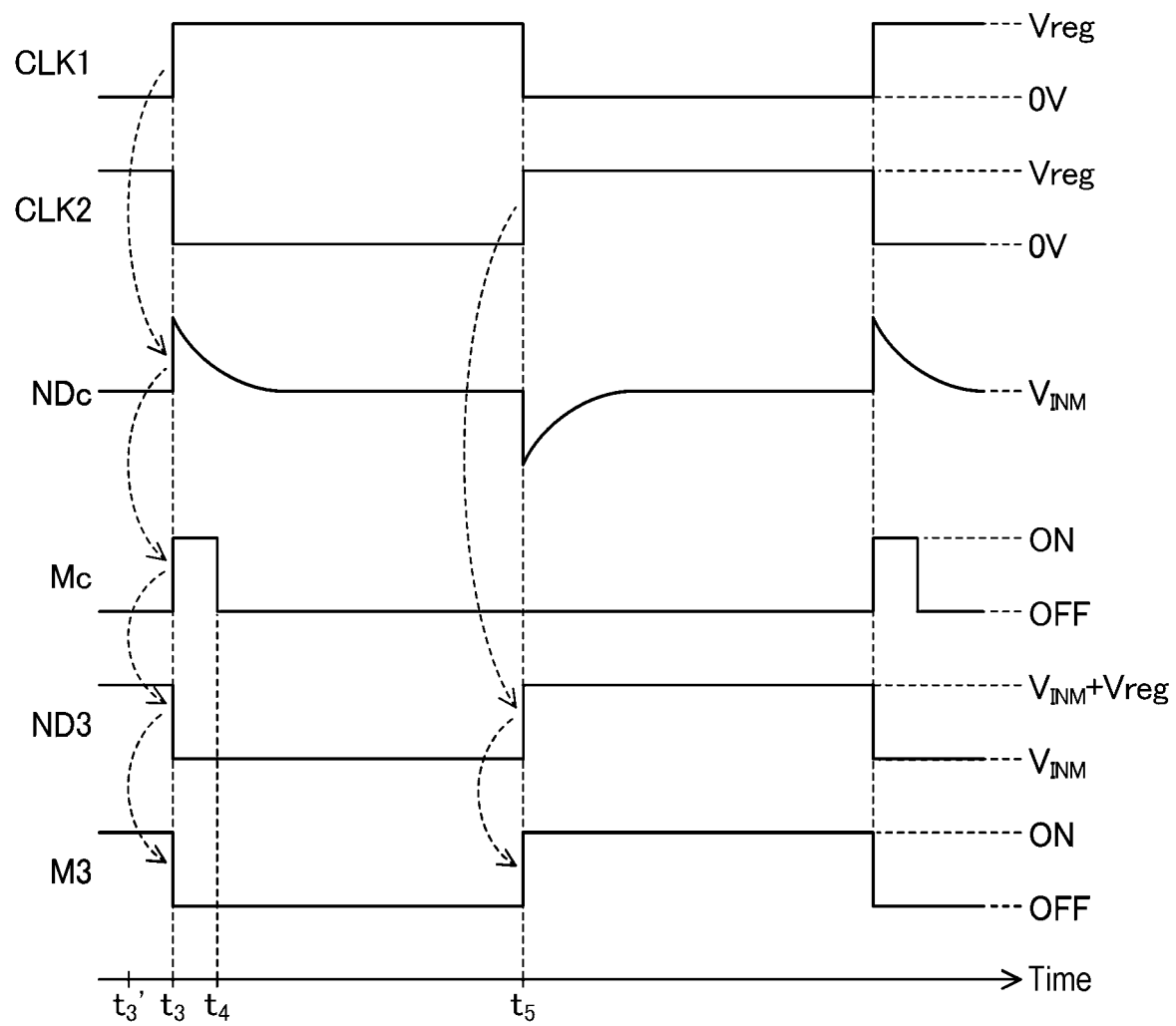
FIG. 13 is a timing chart related to the circuit of FIG. 11.

Operations of the transistor M3 and the gate signal generation circuit 130 will be described with reference to FIG. 13. The operations will be described starting from time $t_3'$. Time $t_3'$ is a time during the low level period of the clock signal CLK1, and is a time immediately before an up-edge of the clock signal CLK1. At time $t_3'$, since a voltage at the node NDc is equal to the voltage $V_{INM}$, the transistor Mc is in an off state. At time $t_3'$, since a voltage at the node ND3 is equal to a voltage ($V_{INM}$+Vreg), the transistor M3 is in an on state.

At time $t_3$ after time $t_3'$, an up-edge occurs in the clock signal CLK1 and a down-edge occurs in the clock signal CLK2.

At time $t_3$, a level change of the clock signal CLK1 is transmitted to the node NDc via the capacitor 132, so that the voltage at the node NDc rises above the voltage $V_{INM}$. The transistor Mc is turned on due to the rise in the voltage at the node NDc at time $t_3$. At time $t_3$, the transistor Mc is turned on, and a level change of the clock signal CLK2 is transmitted to the node ND3 via the capacitor 131. Therefore, at time $t_3$, the voltage at the node ND3 decreases from the voltage ($V_{INM}$+Vreg) to the voltage at the node NDM (therefore, the voltage $V_{INM}$ at the terminal TM1), and as a result, the transistor M3 is turned off.

After time $t_3$, a current flows from the node NDc to the terminal TM1 via the resistor 133, so that a potential of the node NDc decreases, and at time $t_4$, a gate-source voltage of the transistor Mc becomes lower than a gate threshold voltage of the transistor Mc, so that the transistor Mc is turned off. It is assumed that a time difference between times $t_3$ and $t_4$ is shorter than half of one cycle of the clock signal CLK1 or CLK2 (a capacitance value of the capacitor 132 and resistance values of the resistors 133 and 134 are set so as to meet this condition).

Time $t_5$ is a time when half of one cycle of the clock signal CLK1 or CLK2 has elapsed from time $t_3$. After time $t_3$, the voltage at the node ND3 immediately before time $t_5$ substantially matches the voltage $V_{INM}$. At time $t_5$, a down-edge occurs in the clock signal CLK1 and an up-edge occurs in the clock signal CLK2. A level change of the clock signal CLK2 at time $t_5$ is transmitted to the node ND3 via the capacitor 131. Then, at time $t_5$, since the voltage at the node ND3 rises from the voltage $V_{INM}$ to the voltage ($V_{INM}$+Vreg), the transistor M3 is turned on. Thereafter, the transistor M3 is maintained in the on state until a next down-edge occurs in the clock signal CLK2. In addition, during the high level period of the clock signal CLK2, the voltage of the node ND3 may actually fluctuate slightly and transiently from the voltage ($V_{INM}$+Vreg).

As a level change of the clock signal CLK1 at time $t_5$ is transmitted to the node NDc via the capacitor 132, the voltage at the node NDc temporarily drops below the voltage $V_{INM}$, but this drop does not affect the state of the transistor Mc. That is, after time $t_4$, the transistor Mc is maintained in the off state until a next up-edge occurs in the clock signal CLK1. Thereafter, every time an up-edge occurs in the clock signal CLK1, a circuit operation similar to the circuit operations at times $t_3$ and $t_4$ is performed, and every time an up-edge occurs in the clock signal CLK2, a circuit operation similar to the circuit operation at time $t_5$ is performed.

Operations of the transistor M4 and the gate signal generation circuit 140 are similar to the operations of the transistor M3 and the gate signal generation circuit 130 (see FIG. 14). Symbols "M3," "Mc," "131," "132," "133," "134," "ND3," "NDc," "TM1," "$V_{INM}$," and "NDM" in the explanation of the operations of the transistor M3 and the gate signal generation circuit 130 may be read as symbols "M4," "Md," "141," "142," "143," "144," "ND4," "NDd," "TM2," "$V_{INP}$," and "NDP" in the explanation of the operations of the transistor M4 and the gate signal generation circuit 140, respectively. An on period of the transistor M3 matches an on period of the transistor M4. During the on period of the transistor M3, "$V_{OUTP}=V_{INM}$," and during the on period of the transistor M4, "$V_{OUTM}=V_{INP}$."

As described above, at the timing ($t_3$) of the up-edge of the clock signal CLK1, the level change of the clock signal CLK1 is transmitted to the gates of the transistors Mc and Md via the capacitors 132 and 142, respectively, so that the transistors Mc and Md are turned on. As a result, the transistors M3 and M4 are turned off. Thereafter, through the turn-off of the transistors Mc and Md (through $t_4$), the level change of the clock signal CLK2 is transmitted to the gates of the transistors M3 and M4 via the capacitors 131 and 141, respectively, at the timing ($t_5$) of the up-edge of the clock signal CLK2, thereby turning on the transistors M3 and M4.

FIG. 14 collectively shows signal and voltage waveforms of respective components in FIG. 11 and state transition of each transistor.

Here, specific numerical examples related to the current detection amplifier 10 will be given. The internal power supply voltage Vreg is, for example, 4.0 V. Assuming that the maximum value of a voltage assumed as the common mode voltage $V_{CM}$ is 40.0 V, and assuming that the sense voltage $V_{SNS}$ is 0.1 V when the common mode voltage $V_{CM}$ is actually 40.0 V, ($V_{INP}$, $V_{INM}$)=(40.0 V, 39.9 V).

In such numerical examples, 40.0 V may be applied to the electrodes of the transistors M1 to M4 when viewed from the ground. However, according to the configuration shown in FIG. 11, a voltage exceeding the internal power supply voltage Vreg is not applied among the electrodes of the transistors M1 to M4 (the same also applies to the transistors Ma to Md). Therefore, it becomes possible to use a transistor with a low withstand voltage, and it is expected that a size of the transistor and a cost of the current detection amplifier 10 will be reduced.

Figure 15:
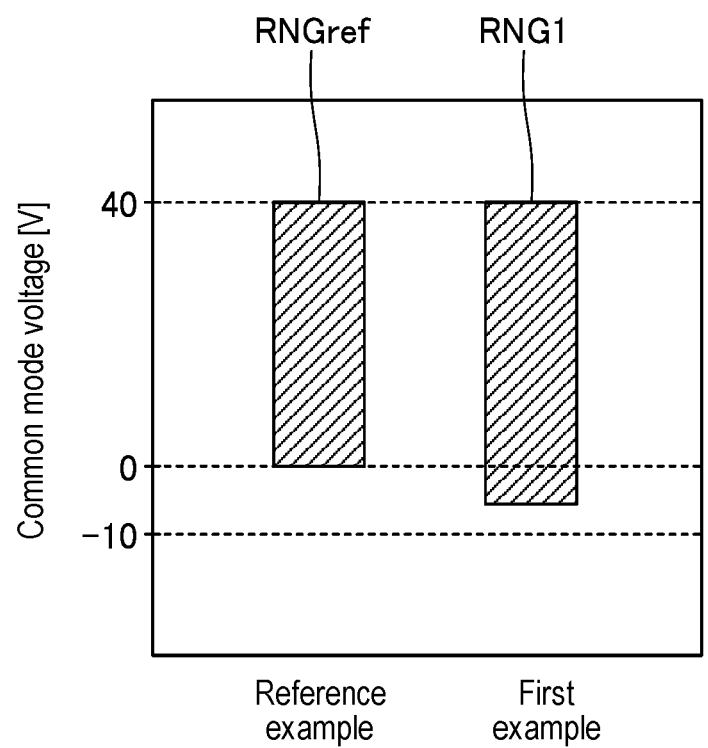
FIG. 15 is a diagram for comparing the reference example and the first example.

In addition, in the current detection amplifier 10, by providing the above-described set of diodes Dy and Dz (see FIG. 10, etc.), it is possible to detect the current $I_{LD}$ even when the voltages of the terminals TM1 and TM2 are negative voltages. For example, in the above numerical examples, it is assumed that even when −7 V is applied to the terminals TM1 and TM2, a withstand voltage of each transistor is designed so that no current flows from the sources of the transistors M1 to M4 and Ma to Md toward the terminal TM1 or TM2. In this case, it is possible to detect the current $I_{LD}$ when the voltages of the terminals TM1 and TM2 are within a voltage range from −7.0 V to 40.0 V. FIG. 15 schematically shows a range RNGref of the common mode voltage $V_{CM}$ in which the current $I_{LD}$ can be detected in the reference example (see FIGS. 5 to 7), and a range RNG1 of the common mode voltage $V_{CM}$ in which the current $I_{LD}$ can be detected in the first example.

When an SOI (Silicon On Insulator) process is used, it is possible to suppress a leakage current between a semiconductor substrate and an input terminal (corresponding to TM1 or TM2) when a negative voltage is input, but adopting the SOI process in the circuit system of the present disclosure results in an increase in circuit area. With the method according to the present disclosure, it is possible to cope with the negative voltage input without increasing the circuit area. In addition, when the SOI process is used, silicon substrates become expensive. The method of the present disclosure is advantageous in terms of cost because it can be implemented using a normal silicon substrate.

In addition, a withstand voltage of the semiconductor substrate connected to the terminals TM1, TM2, 21, and 22 is set to be higher than the common mode voltage $V_{CM}$. Since the capacitors 23 and 24 are respectively provided between the terminal 21 and the circuit 13 and between the terminal 22 and the circuit 13, a withstand voltage of each component in the circuit 13 does not depend on the common mode voltage $V_{CM}$ and is sufficient to be slightly higher than the internal power supply voltage Vreg.

Second Example

A current detection amplifier 10 according to a second example will be explained. When a withstand voltage of an element used as the transistor M1 and the like is not high enough, by adding a clamp circuit to the current detection amplifier 10, it is possible to withstand an input of a negative voltage having an absolute value larger than the withstand voltage of the element. For example, when each switch SW1 to SW4 is configured with the transistor MM (see FIG. 10) having a withstand voltage of 7 V, consider a case where it is desired to further increase a negative side rating of an input voltage for the terminals TM1 and TM2 from −7 V (that is, a case where it is desired to configure the current detection amplifier 10 that allows a voltage lower than −7 V to be applied to the terminals TM1 and TM2). In this case, the above desire can be met by protecting each switch using a Zener diode, and the negative side rating can be increased to a withstand voltage (for example, −16 V) of an element other than each switch SW1 to SW4.

Figure 16:
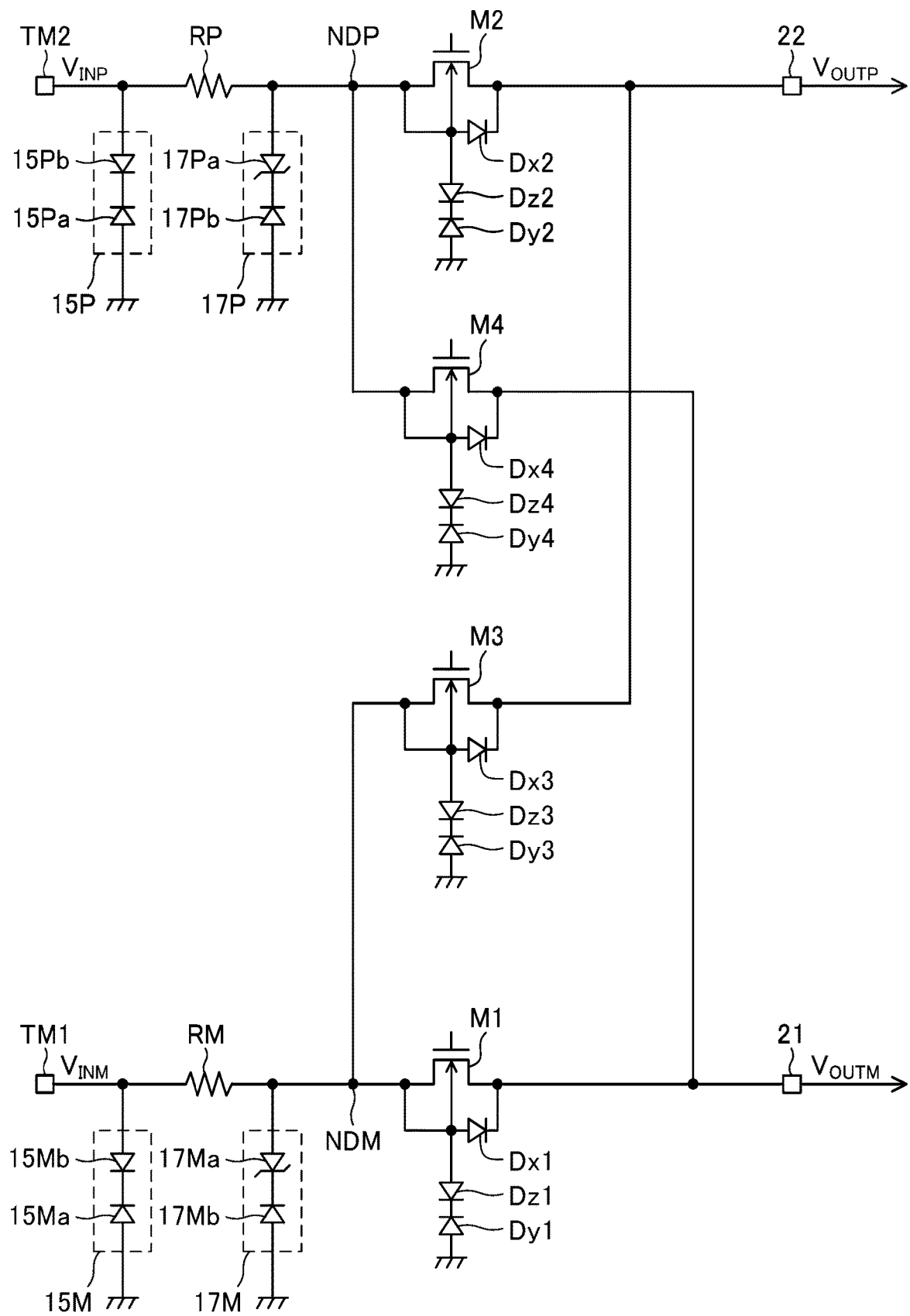
FIG. 16 is a partial configuration diagram of a current detection amplifier according to a second example belonging to the embodiment of the present disclosure.

FIG. 16 shows a partial configuration of the current detection amplifier 10 according to the second example. The current detection amplifier 10 according to the second example is obtained by adding clamp circuits 17P and 17M to the current detection amplifier 10 according to the first example. Except for adding the clamp circuits 17P and 17M, the current detection amplifier 10 according to the second example is the same as the current detection amplifier 10 according to the first example. Therefore, in the second example, only the clamp circuits 17P and 17M will be described below.

The clamp circuit 17P is connected between the node NDP and the ground. The clamp circuit 17P includes a Zener diode 17Pa and a diode 17Pb that are connected in series and have mutually opposite forward directions. Specifically, an anode of the Zener diode 17Pa is connected to the node NDP. A cathode of the Zener diode 17Pa is connected to a cathode of the diode 17Pb. An anode of the diode 17Pb is connected to the ground.

The clamp circuit 17M is connected between the node NDM and the ground. The clamp circuit 17M includes a Zener diode 17Ma and a diode 17Mb that are connected in series and have mutually opposite forward directions. Specifically, an anode of the Zener diode 17Ma is connected to the node NDM. A cathode of the Zener diode 17Ma is connected to a cathode of the diode 17Mb. An anode of the diode 17Mb is connected to the ground.

For example, consider a case where each switch SW1 to SW4 is configured with the transistor MM (see FIG. 10) having a withstand voltage of 7 V. In this case, assuming that the clamp circuits 17P and 17M are not provided, the diode Dz of each switch breaks down when a voltage lower than −7 V is applied to the terminal TM1 or TM2. In this case, Zener diodes having appropriate Zener voltages may be employed as the Zener diodes 17Pa and 17Ma so that the voltages of the nodes NDP and NDM do not fall below a predetermined clamp voltage higher than −7 V. For example, the clamp voltage may be set to −5.8 V. At this time, assuming that a forward voltage of each of the diodes 17Pb and 17Mb is 0.6 V, the Zener diodes 17Pa and 17Ma may have a Zener voltage of 5.2 V.

Figure 17:
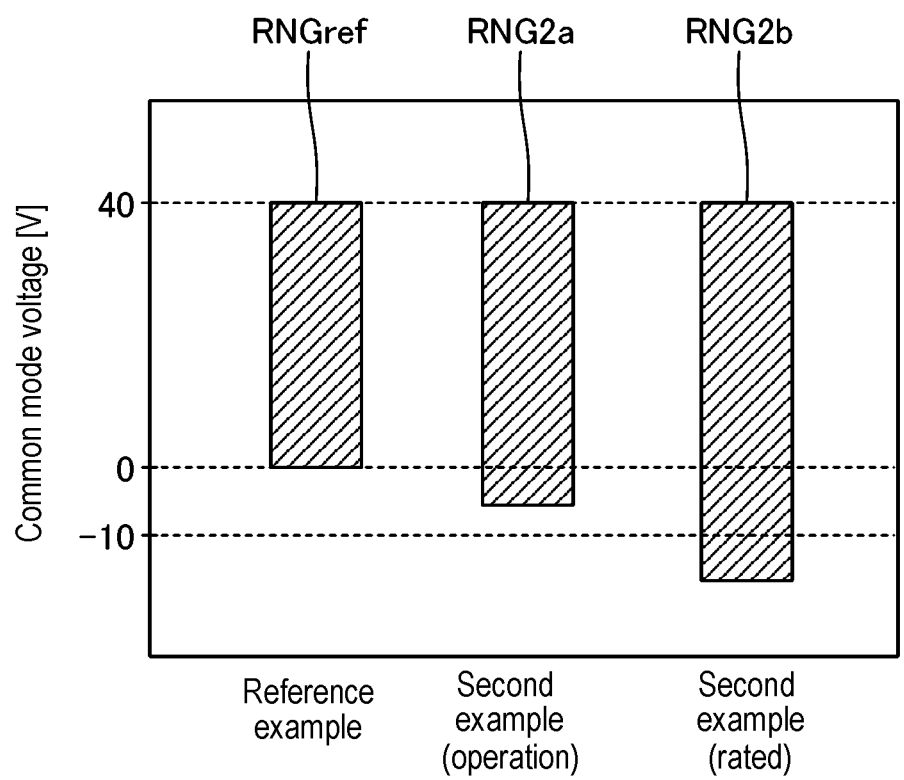
FIG. 17 is a diagram for comparing the reference example and the second example.

FIG. 17 schematically shows a range RNGref of the common mode voltage $V_{CM}$ in which the current $I_{LD}$ can be detected in the reference example (see FIGS. 5 to 7), a range RNG2a of the common mode voltage $V_{CM}$ in which the current $I_{LD}$ can be detected in the second example, and a rated range RNG2b of the common mode voltage $V_{CM}$ in the second example. A lower limit of the rated range RNG2b is lower than a lower limit of the range RNG2a and is determined by a withstand voltage (for example, −16 V) of an element other than each switch SW1 to SW4.

Structures of the clamp circuits 17P and 17M are arbitrary as long as the above-described clamp circuits 17P and 17M can be configured. As an example, FIG. 18 shows a vertical structure of components of the clamp circuit 17P or 17M when the clamp circuit 17P or 17M is formed on the above-described semiconductor substrate 600.

The semiconductor substrate 600 is connected to the ground. A buried layer 632 is formed on the main surface side of the semiconductor substrate 600. The buried layer 632 is an N-type semiconductor region. The buried layer 632 may be an $N^+$ semiconductor region. In the semiconductor substrate 600, an N-type epitaxial layer 634, which is an N-type semiconductor region, is formed above the buried layer 632. In addition, in the semiconductor substrate 600, N-type semiconductor regions 636 and 637 are formed above the buried layer 632. In addition, an anode region 641, which is a P-type semiconductor region ($P^+$ diffusion region), is formed above the N-type semiconductor region 636, and a cathode region 642, which is an N-type semiconductor region ($N^+$ diffusion region), is formed above the N-type semiconductor region 637.

The N-type epitaxial layer 634 ($N^-$ semiconductor region) is interposed between a formation position of a combination of the N-type semiconductor region 636 and the anode region 641 and a formation position of a combination of the N-type semiconductor region 637 and the cathode region 642. The anode region 641 and the cathode region 642 are exposed on the upper side. On the surface side of the semiconductor substrate 600, the anode region 641 and the cathode region 642 are isolated from each other by an oxide film formed by LOCOS or the like.

A relationship between the structure shown in FIG. 18 and the Zener diode 17Pa and the diode 17Pb will be explained. The anode region 641 can constitute the anode of the Zener diode 17Pa, and the N-type semiconductor region including the cathode region 642 can constitute the cathode of the Zener diode 17Pa. In addition, a diode formed by a PN junction between the P-type semiconductor substrate 600 and the N-type buried layer 632 can be used as the diode 17Pb. Alternatively, a diode having a cathode electrically connected to the cathode region 642 may be formed separately as the diode 17Pb. The structures of the Zener diode 17Ma and the diode 17Mb are the same as those of the Zener diode 17Pa and the diode 17Pb.

Third Example

A current detection amplifier 10 according to a third example will be explained. In the third example, applied techniques or modified techniques related to the current detection amplifier 10, or supplementary matters to each of the above-mentioned techniques will be explained.

The transistor M1 has the parasitic diode Dx1 having a forward direction from the source to the drain (see FIG. 8). Therefore, in a case where a source potential of the transistor M1 is equal to or higher than a forward voltage (for example, 0.6 V) of the parasitic diode Dx1, or is higher than a drain potential of the transistor M1, even when the transistor M1 is in an off state, a forward current can flow through the parasitic diode Dx1. The same also applies to the transistors M2 to M4. However, the current detection amplifier 10 is designed and operates on the premise that the voltage across the sense resistor $R_{SNS}$ (that is, the sense voltage $V_{SNS}$) is equal to or below a predetermined allowable difference voltage which is lower (for example, 0.1 V to 0.3 V) than the forward voltage of the parasitic diodes (Dx1 to Dx4) of the MOSFET. Therefore, in the normal input state, no current flows through the parasitic diodes Dx1 to Dx4 of the transistors M1 to M4.

Here are some numerical examples. If the sense voltage $V_{SNS}$ is 0.2 V when the common mode voltage $V_{CM}$ is 40.0 V, $(V_{INP}, V_{INM})=(40.0$ V, $39.8$ V). In this case (see FIG. 4), in the state ST1, $(V_{OUTP}, V_{OUTM})=(40.0$ V, $39.8$ V), and in the state ST2, $(V_{OUTP}, V_{OUTM})=(39.8$ V, $40.0$ V). That is, an absolute value of a drain-source voltage of the transistor M1 is equal to or smaller than 0.2 V, and the parasitic diode Dx1 is not conductive. The same also applies to the transistors M2 to M4.

Each of the switches SW1 to SW4 may be formed by a series circuit of first and second MOSFETs. The first and second MOSFETs are N-channel type MOSFETs each having the same structure as the above-described transistor MM (see FIG. 10). Drains of the first and second MOSFETs are connected in common to each other in the switches SW1 to SW4. In this case, even when a voltage exceeding a forward voltage of the MOSFET is applied across the switch, no forward current flows through the parasitic diode of the MOSFET.

When each of the switches SW1 to SW4 is formed by the series circuit of first and second MOSFETs, specifically, the following may be performed.

In the switch SW1, a source of the first MOSFET is connected to the node NDM, a source of the second MOSFET is connected to the terminal 21, and drains of the first and second MOSFETs are connected to each other. A gate of each of the first and second MOSFETs in the switch SW1 is connected to the node ND1 (see FIG. 11).

In the switch SW2, a source of the first MOSFET is connected to the node NDP, a source of the second MOSFET is connected to the terminal 22, and drains of the first and second MOSFETs are connected to each other. A gate of each of the first and second MOSFETs in the switch SW2 is connected to the node ND2 (see FIG. 11).

In the switch SW3, a source of the first MOSFET is connected to the node NDM, a source of the second MOSFET is connected to the terminal 22, and drains of the first and second MOSFETs are connected to each other. A gate of each of the first and second MOSFETs in the switch SW3 is connected to the node ND3 (see FIG. 11).

In the switch SW4, a source of the first MOSFET is connected to the node NDP, a source of the second MOSFET is connected to the terminal 21, and drains of the first and second MOSFETs are connected to each other. A gate of each of the first and second MOSFETs in the switch SW4 is connected to the node ND4 (see FIG. 11).

Hereinafter, each or any of the transistors M1 to M4 and Ma to Md is referred to as a target transistor for the sake of convenience. It has been described above that the transistor MM (see FIG. 10), which is a floating N-channel MOSFET, is formed as the target transistor on the P-type semiconductor substrate 600. However, as long as a set of diodes having mutually opposite forward directions is formed in series between a back gate of the target transistor and the semiconductor substrate, structures and characteristics of the target transistor and the semiconductor substrate can be changed arbitrarily.

For example, a modification may be applied in which a P-channel type MOSFET is formed as a target transistor on an N-type semiconductor substrate. In this case, in the structure of the transistor MM shown in FIG. 10, conductivity types of the semiconductor substrate and each semiconductor region may be reversed to those described above. That is, a modification can be applied in which the semiconductor substrate 600 is an N-type semiconductor substrate, the buried layer 602 is a P-type semiconductor region, the well 604 is an N-type semiconductor region, the well 621 is a P-type semiconductor region, the regions 611, 612, and 622 are P-type semiconductor regions (P+ semiconductor regions), and the region 615 is an N-type semiconductor region (N+ semiconductor region). With this modification, the transistor MM formed on the N-type semiconductor substrate 600 is a P-channel type MOSFET, and the transistor MM as a P-channel type MOSFET can be used as a target transistor. In addition, regarding a semiconductor, one of N-type and P-type is a first conductivity type, and the other is a second conductivity type.

It is assumed in the above embodiment that the voltage Vreg is a voltage generated from the power supply voltage VDD, but the voltage Vreg may be the power supply voltage VDD itself supplied to the terminal TM4 from the outside of the current detection amplifier 10. In this case, the internal power supply circuit 14 can be omitted from the current detection amplifier 10.

Although the configuration in which the sense resistor $R_{SNS}$ is externally connected to the current detection amplifier 10 has been described above, the sense resistor $R_{SNS}$ may be built in the current detection amplifier 10. In this case, a current sensor is formed by the current detection amplifier 10 alone that includes the built-in sense resistor $R_{SNS}$.

Although the configuration in which the sense resistor $R_{SNS}$ is provided on the higher potential side than the load LD has been described above, the sense resistor $R_{SNS}$ may be provided on the lower potential side than the load LD.

The current detection amplifier 10 can be applied to any applications (for example, an analog front end for a vehicle sensor, an analog front end for a medical sensor, a magnetic sensor, a pressure sensor, and the like). The current detection amplifier 10 may be installed in a vehicle such as an automobile, and the current detection amplifier 10 may be applied to any load LD in the vehicle. For automotive electronic components that often require high withstand voltages, coping with negative voltage input is beneficial in that safety can be ensured even in a case where a ground potential fluctuates. In addition, further benefits are created by enabling normal current detection even when a negative voltage is input. In addition, in the above-described embodiment, the semiconductor device as the current detection amplifier 10 is used as a component of the current sensor, but the use of the semiconductor device is arbitrary. The semiconductor device can be used as any device that detects and amplifies a voltage difference between the terminals TM1 and TM2.

Regarding an arbitrary signal or voltage, the relationship between high level and low level as described above can be reversed, without detracting from the spirit of the above.

The embodiments of the present disclosure can be appropriately modified in various ways within the scope of the technical ideas shown in the claims. The above-described embodiments are merely examples of the embodiments of the present disclosure, and the meanings of the terms of the present disclosure or components are not limited to those described in the above-described embodiments. The specific numerical values shown in the above description are merely examples, and it goes without saying that they can be changed to various numerical values.

Supplementary Notes

Supplementary notes will be provided for the present disclosure in which specific configuration examples are shown in the above-described embodiments.

A semiconductor device (10) according to one aspect of the present disclosure has a configuration (first configuration) that includes: a first input terminal (TM1) and a second input terminal (TM2) configured to be connected to both ends of a sense resistor ($R_{SNS}$), respectively; a square wave generation circuit (11) configured to receive a voltage applied to the first input terminal and the second input terminal and generate a square wave signal having an amplitude proportional to a voltage ($V_{SNS}$) across the sense resistor; a current detection signal output circuit (13) configured to output a current detection signal (Sour) according to a current flowing through the sense resistor based on the square wave signal; and a switch control circuit (12), wherein the square wave generation circuit has: a first output terminal (21) and a second output terminal (22); a first switching transistor (SW1) provided between the first input terminal and the first output terminal; a second switching transistor (SW2) provided between the second input terminal and the second output terminal; a third switching transistor (SW3) provided between the first input terminal and the second output terminal; and a fourth switching transistor (SW4) provided between the second input terminal and the first output terminal, wherein the switch control circuit generates the square wave signal between the first output terminal and the second output terminal by controlling states of the first to fourth switching transistors, wherein each of the switching transistors is composed of a MOSFET, and wherein a set of diodes (Dy and Dz) having mutually opposite forward directions is formed in series between a back gate of each of the switching transistors and the ground.

In a configuration in which a voltage between the first and second input terminals is directly monitored, an element receiving voltages of the first and second input terminals is required to have a withstand voltage higher than a voltage applied to each input terminal. An increase in the required withstand voltage leads to an increase in size and cost of a device. When a method of generating a square wave signal having an amplitude proportional to a voltage across a sense resistor and outputting a current detection signal based on the square wave signal as in the first configuration is used, it is possible to reduce the required withstand voltage of the element receiving the voltages of the first and second input terminals.

In addition, when a negative voltage is applied to the first input terminal or the second input terminal, there is a concern that a leakage current may flow from the ground to the first input terminal or the second input terminal via the switching transistors. In the first configuration, since the set of diodes having mutually opposite forward directions is formed in series between the back gate of each of the switching transistors and the ground, the leakage current can be suppressed. By suppressing the leakage current, it is possible to perform a current detection operation even when the negative voltage is input.

The semiconductor device of the first configuration may have a configuration (second configuration) that each of the switching transistors is formed on a semiconductor substrate (600) connected to the ground, and the set of diodes is formed between the semiconductor substrate and the back gate of each of the switching transistors.

The semiconductor device of the second configuration may have a configuration (third configuration) that the semiconductor substrate (600) has a first conductivity type (for example, p-type), the back gate of each of the switching transistors is formed in a semiconductor region (615) of the first conductivity type, and a semiconductor layer (602) of a second conductivity type is provided between the semiconductor substrate and the semiconductor region of the first conductivity type to form the set of diodes between the semiconductor substrate and the back gate of each of the switching transistors.

The semiconductor device of any one of the first to third configurations may have a configuration (fourth configuration) that the switch control circuit generates the square wave signal between the first output terminal and the second output terminal by alternately switching between a first state (ST1) in which the first switching transistor and the second switching transistor are controlled to be in an on state and the third switching transistor and the fourth switching transistor are controlled to be in an off state, and a second state (ST2) in which the first switching transistor and the second switching transistor are controlled to be in an off state and the third switching transistor and the fourth switching transistor are controlled to be in an on state.

The semiconductor device of any one of the first to fourth configurations may have a configuration (fifth configuration) that the semiconductor device further includes: a first protection circuit (15M) connected between the first input terminal and the ground; and a second protection circuit (15P) connected between the second input terminal and the ground, wherein the first protection circuit has a series circuit of a first electrostatic protection diode (15Ma) and a first backflow prevention diode (15Mb) having mutually opposite forward directions, and wherein the second protection circuit has a series circuit of a second electrostatic protection diode (15Pa) and a second backflow prevention diode (15Pb) having mutually opposite forward directions.

By providing a backflow prevention diode in each protection circuit, it is possible to suppress a leakage current from each protection circuit to each input terminal when a negative voltage is input to the first input terminal or the second input terminal.

The semiconductor device of the fifth configuration may have a configuration (sixth configuration) that a first protection resistor (RM) is interposed between a connection node between the first input terminal and the first protection circuit and the first and third switching transistors, and a second protection resistor (RP) is interposed between a connection node between the second input terminal and the second protection circuit and the second and fourth switching transistors.

The semiconductor device of the sixth configuration may have a configuration (seventh configuration) that the first protection resistor has a first end connected to the connection node between the first input terminal and the first protection circuit, and a second end, the second protection resistor has a first end connected to the connection node between the second input terminal and the second protection circuit, and a second end, a series circuit of a first Zener diode (17Ma) and a first series diode (17Mb) having mutually opposite forward directions is connected between the second end of the first protection resistor and the ground, a series circuit of a second Zener diode (17Pa) and a second series diode (17Pb) having mutually opposite forward directions is connected between the second end of the second protection resistor and the ground, the first Zener diode has a forward direction from the second end of the first protection resistor to the ground, and the second Zener diode has a forward direction from the second end of the second protection resistor to the ground.

With this configuration, it is possible to increase a rated voltage on a negative side for each input terminal.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device comprising:
a first input terminal and a second input terminal configured to be connected to both ends of a sense resistor, respectively;

a square wave generation circuit configured to receive a voltage applied to the first input terminal and the second input terminal and generate a square wave signal having an amplitude proportional to a voltage across the sense resistor;
a current detection signal output circuit configured to output a current detection signal according to a current flowing through the sense resistor based on the square wave signal; and
a switch control circuit,
wherein the square wave generation circuit has:
 a first output terminal and a second output terminal;
 a first switching transistor provided between the first input terminal and the first output terminal;
 a second switching transistor provided between the second input terminal and the second output terminal;
 a third switching transistor provided between the first input terminal and the second output terminal; and
 a fourth switching transistor provided between the second input terminal and the first output terminal,
wherein the switch control circuit generates the square wave signal between the first output terminal and the second output terminal by controlling states of the first to fourth switching transistors,
wherein each of the switching transistors is composed of a MOSFET, and
wherein a set of diodes having mutually opposite forward directions is formed in series between a back gate of each of the switching transistors and the ground.

2. The semiconductor device of claim 1, wherein each of the switching transistors is formed on a semiconductor substrate connected to the ground, and
wherein the set of diodes is formed between the semiconductor substrate and the back gate of each of the switching transistors.

3. The semiconductor device of claim 2, wherein the semiconductor substrate has a first conductivity type,
wherein the back gate of each of the switching transistors is formed in a semiconductor region of the first conductivity type, and
wherein a semiconductor layer of a second conductivity type is provided between the semiconductor substrate and the semiconductor region of the first conductivity type to form the set of diodes between the semiconductor substrate and the back gate of each of the switching transistors.

4. The semiconductor device of claim 1, wherein the switch control circuit generates the square wave signal between the first output terminal and the second output terminal by alternately switching between a first state in which the first switching transistor and the second switching transistor are controlled to be in an on state and the third switching transistor and the fourth switching transistor are controlled to be in an off state, and a second state in which the first switching transistor and the second switching transistor are controlled to be in an off state and the third switching transistor and the fourth switching transistor are controlled to be in an on state.

5. The semiconductor device of claim 1, further comprising:
a first protection circuit connected between the first input terminal and the ground; and
a second protection circuit connected between the second input terminal and the ground,
wherein the first protection circuit has a series circuit of a first electrostatic protection diode and a first backflow prevention diode having mutually opposite forward directions, and
wherein the second protection circuit has a series circuit of a second electrostatic protection diode and a second backflow prevention diode having mutually opposite forward directions.

6. The semiconductor device of claim 5, wherein a first protection resistor is interposed between a connection node between the first input terminal and the first protection circuit and the first and third switching transistors, and
wherein a second protection resistor is interposed between a connection node between the second input terminal and the second protection circuit and the second and fourth switching transistors.

7. The semiconductor device of claim 6, wherein the first protection resistor has a first end connected to the connection node between the first input terminal and the first protection circuit, and a second end,
wherein the second protection resistor has a first end connected to the connection node between the second input terminal and the second protection circuit, and a second end,
wherein a series circuit of a first Zener diode and a first series diode having mutually opposite forward directions is connected between the second end of the first protection resistor and the ground,
wherein a series circuit of a second Zener diode and a second series diode having mutually opposite forward directions is connected between the second end of the second protection resistor and the ground,
wherein the first Zener diode has a forward direction from the second end of the first protection resistor to the ground, and
wherein the second Zener diode has a forward direction from the second end of the second protection resistor to the ground.

* * * * *